US010242546B1

(12) United States Patent
Wright

(10) Patent No.: US 10,242,546 B1
(45) Date of Patent: Mar. 26, 2019

(54) ELECTRONIC MONITORING OF CABINET STATUSES

(71) Applicant: Equinix, Inc., San Jose, CA (US)

(72) Inventor: Anthony Donald Wright, Enumclaw, WA (US)

(73) Assignee: EQUINIX, Inc., Redwood City, CA (US)

( * ) Notice: Subject to any disclaimer, the term of this patent is extended or adjusted under 35 U.S.C. 154(b) by 0 days.

(21) Appl. No.: 15/474,745

(22) Filed: Mar. 30, 2017

Related U.S. Application Data

(60) Provisional application No. 62/441,123, filed on Dec. 30, 2016.

(51) Int. Cl.
*G08B 21/00* (2006.01)
*G08B 21/18* (2006.01)
*H05K 7/14* (2006.01)
*G05D 23/19* (2006.01)

(52) U.S. Cl.
CPC ......... *G08B 21/18* (2013.01); *G05D 23/1917* (2013.01); *H05K 7/1488* (2013.01); *H05K 7/1498* (2013.01)

(58) Field of Classification Search
CPC .. G08B 21/18; G05D 23/1917; H05K 7/1488; H05K 7/1498; H05K 7/20836; G06F 1/206; G06F 1/3203; G06F 1/324; Y02D 10/126; Y10S 439/928
USPC ............... 340/686.1, 540, 545.6, 500, 691.1; 361/727, 721
See application file for complete search history.

(56) References Cited

U.S. PATENT DOCUMENTS

| | | | |
|---|---|---|---|
| 8,704,642 B2* | 4/2014 | Chen ..................... | G06K 17/00 235/382 |
| 2006/0184051 A1* | 8/2006 | Hempstead ......... | A61B 5/02028 600/485 |
| 2011/0056348 A1* | 3/2011 | Birch ................... | B23D 45/003 83/35 |
| 2012/0031965 A1* | 2/2012 | Thielmann ........... | H05K 7/1421 235/375 |
| 2014/0163726 A1* | 6/2014 | Shoenfeld ........... | G07F 17/0092 700/241 |
| 2016/0135323 A1* | 5/2016 | Haroun ................ | H05K 7/1485 361/679.53 |
| 2017/0126505 A1* | 5/2017 | Cencini ................. | H04L 67/22 |
| 2017/0201424 A1 | 7/2017 | Doraiswamy et al. | |
| 2017/0201425 A1 | 7/2017 | Marinelli et al. | |

* cited by examiner

*Primary Examiner* — Anh V La
(74) *Attorney, Agent, or Firm* — Shumaker & Sieffert, P.A.

(57) ABSTRACT

Examples of monitoring circuitry include a receiver circuit configured to receive a plurality of status indication signals, each status indication signal comprising information indicative of a cabinet occupancy status associated with one or more cabinets located in a data center storage space, a processor circuit configured to process the received status indication signals, and to determine if any of the status indication signals include an occupancy status indicating that the cabinet associated with the occupancy status indicates that at least one slot of the cabinet is not occupied with either the electronic device or the blanking cover, and to generate a status output signal indicative of any of the plurality of cabinets that are not fully occupied.

24 Claims, 16 Drawing Sheets

FIG. 9

ZONE 100 (901)

| CABINET NUMBER | CURRENT STATUS |
|---|---|
| 101 | OCCUPIED |
| 102 | OCCUPIED |
| 103 | OPEN SLOT |
| 104 | MULTIPE OPEN SLOTS |
| 105 | NOT RESPONDING |
| 106 | OCCUPIED |

ZONE 200 (902)

| CABINET NUMBER | CURRENT STATUS |
|---|---|
| 201 | OCCUPIED |
| 202 | OCCUPIED |
| 203 | OCCUPIED |
| 204 | OCCUPIED |
| 205 | OCCUPIED |
| 206 | OCCUPIED |
| 207 | OCCUPIED |
| 208 | OCCUPIED |
| 209 | OCCUPIED |
| 210 | OCCUPIED |
| 211 | OCCUPIED |

ZONE 300 (903)

| CABINET NUMBER | CURRENT STATUS |
|---|---|
| 301 | OCCUPIED |
| 302 | OCCUPIED |
| 303 | OCCUPIED |
| 304 | OCCUPIED |
| 305 | OCCUPIED |
| 306 | OCCUPIED |
| 307 | OCCUPIED |
| 308 | OCCUPIED |
| 309 | OCCUPIED |
| 310 | OCCUPIED |
| 311 | OCCUPIED |
| 312 | OCCUPIED |

ZONE 400 (904)

| CABINET NUMBER | CURRENT STATUS |
|---|---|
| 401 | OCCUPIED |
| 402 | OCCUPIED |
| 403 | OCCUPIED |
| 404 | OCCUPIED |
| 405 | OCCUPIED |
| 406 | OCCUPIED |
| 407 | OCCUPIED |
| 408 | OCCUPIED |
| 409 | OCCUPIED |
| 410 | OCCUPIED |
| 411 | OCCUPIED |
| 412 | OCCUPIED |
| 413 | OCCUPIED |
| 414 | OCCUPIED |
| 415 | OCCUPIED |
| 416 | OCCUPIED |
| 417 | OCCUPIED |
| 418 | OCCUPIED |
| 419 | OCCUPIED |
| 420 | OCCUPIED |

ELECTRONIC MONITORING OF CABINET STATUSES

RELATED APPLICATION

The application claims the benefit of priority of U.S. Provisional Application Ser. No. 62/441,123, filed Dec. 30, 2016, the contents of which is incorporated herein in its entirety.

TECHNICAL FIELD

The disclosure relates to facility management, and more specifically, to monitoring equipment within a data center facility.

BACKGROUND

A facility such as a data center includes a data center storage space storing numerous electronic devices that produce heat, including network, server, and storage gear, as well as power distribution units for distributing power to devices within the facility. A cooling unit may be used to supply a cool air stream into the storage volume. Warm exhaust produced by electronic devices within the storage volume may be returned to the cooling unit as return air for cooling and recirculation within the storage volume. This return, cooling, and recirculation of air within the facility may help to keep the air within the storage volume cool to maintain safety, performance, and reliability of the electronic devices within the storage volume.

SUMMARY

In general, techniques of the disclosure are directed to monitoring circuitry and techniques for monitoring cabinets in a data center storage space with respect to the occupancy statuses of slots of the cabinets. The cabinet slots may be configured to receive a device, such as an electronic device or a blanking cover. Unoccupied slots in cabinets may create air flow issues within the data center that may reduce efficiency of cooling the data center storage space.

Examples of the systems, devices and techniques described in this disclosure enable electronic and real-time monitoring of the occupancy statuses for a plurality of cabinets in one or more data centers. Cabinets may be designed for housing electronic equipment, such as servers, switches, or other equipment. Examples of the systems, devices and techniques described in this disclosure include monitoring systems that are highly scalable for use in large and small data centers, having a wide range in the number of server cabinets that may be monitored, and may be configured to monitor cabinets in different data centers and/or at different physical locations at a same time and in real-time.

Examples of the systems, devices and techniques described in this disclosure provide generation of various graphical displays that provide information regarding the status of the monitored server cabinets being monitored, providing a convenient tool for determining if and where any unoccupied slot issues may exist. These graphical displays may be provided to various devices located inside the data center, included mobile devices such laptop computer and cellular phones, this allowing a person to move about the data center while still being able to access and view the occupancy status information. These graphical displays may be provided to various devices located outside the data center, for example to allow customers to remotely monitor the occupancy statues of their server cabinets located within the data center.

The techniques of this disclosure may result in improved efficiency for cooling the data center storage space, potentially reducing data center operation costs. The techniques of this disclosure may improve data center cooling, thus potentially avoiding equipment downtime and/or equipment failure, and improving the system reliability of the functions and services being provided by the affected devices housed within the data center. In addition, the techniques of this disclosure may allow for convenient and timely monitoring of many individual cabinets within a given data center.

One example includes a system comprising: a receiver circuit configured to receive a plurality of status indication signals, each status indication signal comprising information indicative of a cabinet occupancy status associated with one or more server cabinets located in a data center storage space, wherein each of the one or more server cabinets comprises a plurality of slots configured to receive either an electronic device or a blanking cover, each of the plurality of slots comprising a sensor device configured to provide a sensor output signal indicative of whether the slot where the sensor device is located is occupied with either the electronic device or the blanking cover; and a processor circuit configured to: process the received status indication signals, and to determine if any of the status indication signals include an occupancy status indicating that the cabinet associated with the occupancy status indicates that at least one slot of the cabinet is not occupied with either the electronic device or the blanking cover, and generate a status output signal indicative of any of the plurality of server cabinets that are not fully populated.

Another example includes a system comprising a plurality of detection devices, each of the plurality of detection devices located at one of a plurality of slots of a server cabinet, each of the plurality of detection devices configured to detect a physical presence of a device at the slot where the detection device is located, and to provide a status output signal indicative of whether the physical presence of the device is detected at the slot where the detection device is located; and a cabinet status monitoring circuit comprising at least one interface configured to receive the status output signal from each of the plurality of detection devices, and to generate a status output signal indicative of an occupancy status for the server cabinet based on the status output signals provided by the plurality of detection devices.

Examples also include a method comprising receiving, using receiver circuitry, an occupancy status signal from each of a plurality of server cabinets located in a data center storage space, the occupancy status signal comprising information indicative of an occupancy status for each of the server cabinets; processing, using processing circuitry, the occupancy status signal receive from each of the server cabinets to determine an occupancy status indication for each of the server cabinets based on the information provided in the status signal associated with each server cabinet; generating, using the processing circuitry, a graphical image comprising a graphical representation of the occupancy status indications for one or more of the server cabinets included in the data center storage space; and outputting the graphical image for display.

Examples also include a method comprising: detecting, by each of a plurality of sensor devices located at respective slots of a server cabinet, whether an electronic device or a blanking cover are installed at the respective slots from each of the individual sensor devices, generating, by each of the plurality of sensor devices, a sensor output signal, the sensor output signal indicative of whether an electronic device or a blanking cover was detected by the individual sensor device; receiving, at an input circuit, each of the sensor output signals; generating, using processing circuitry, a cabinet status output signal based on the received sensor output signals, the cabinet status output signal comprising at least an indication of whether any of the sensor output signals indicated that a slot of the server cabinet was not occupied by and electronic device or by a blanking cover installed at the slot; and transmitting, using communication circuitry, the cabinet status output signal to one or more external devices.

The details of one or more examples are set forth in the accompanying drawings and the description below. Other features, objects, and advantages of the disclosure will be apparent from the description and drawings, and from the claims.

BRIEF DESCRIPTION OF DRAWINGS

FIG. 9 illustrates another example of a graphical display generated and displayed in accordance with one or more example techniques of this disclosure.

In the figures, like reference characters denote like elements throughout the figures and text.

DETAILED DESCRIPTION

Figure 1:
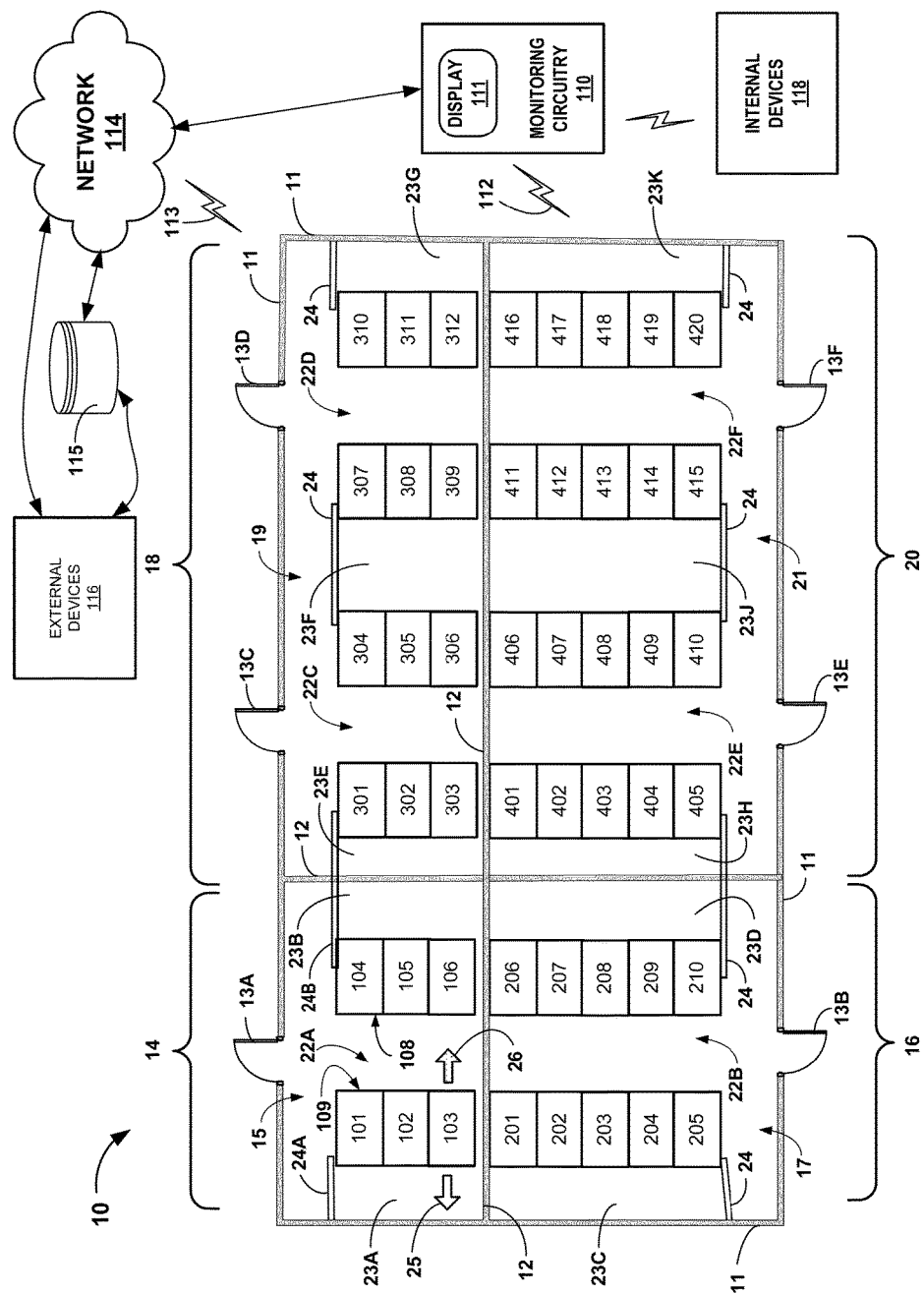
FIG. 1 illustrates a plan view of a data center storage space including cabinet status monitoring in accordance with one or more example techniques of the disclosure.

A data center may house numerous electronic devices that produce heat, including network, server, and storage gear, as well as power distribution units (PDUs) for distributing power to devices within the facility. In some examples, the data center may employ a horizontal cooling air supply system for cooling electronic devices within the data center. Servers and other equipment housed in server cabinets may pull cool air from streams of cool air in relatively cooler "cold aisles" as needed and discharge warm server exhaust into contained "hot aisles" that are relatively hotter. The warm server exhaust may be returned to a cooling unit as return air for cooling and recirculation in cool air streams in the cold aisles.

The hot aisles are generally separated from the cold aisles by physical structures such as walls and/or airway that may be designed to direct the cold air to a front side of the server cabinets, and remove and/or recirculate the hot air that is normally expelled from a back side of the server cabinets into one or more hot aisles. Most server cabinets comprise a series of slots, each slot designed to receive a piece of electronic equipment (e.g., an electronic device). Thus, a given server cabinet may house a plurality of electronic devices, and when these electronic devices are installed in the slots of the server cabinet, they substantially seal the area of the slot with respect to airflow back out through the front face of the server cabinet. If the number of electronic devices to be installed at any given time in a server cabinet is less than the total number of slots provided by the server cabinet, a blank cover may be inserted in any unused slots. These blank covers generally provide the equivalent function of an electronic device installed in the slot with respect to preventing an unwanted airflow of heated air through the slot and out the front side of the server cabinet.

However, in instances where one or more unused slots in a server cabinet are not covered by a blanking cover and are left open (e.g., are unoccupied), heated air from within the server cabinet may exit out through the unoccupied slot to mix with the cooled air being provided to cool the data center storage space that are installed in the server cabinet and in other server cabinets that may be provided cooling air by the same or other the cold aisles now mixed with the heated air from the unoccupied slot. This mixing of the heated air may cause several issues related to maintaining the proper air temperatures within the data center, including issues related to meeting any customer service level agreement (SLA) terms defining temperature requirements for the data center. Examples of the monitoring circuit described in this disclosure include sets of sensor devices located at the slots of a server cabinet and configured to detect if a slot of the cabinet is unoccupied by either an electronic device or a blanking cover. The signals from the sensors are transmitted through various communication channels, and are used to determine and to monitor, electronically and in real-time, the occupancy statuses of the server cabinets being monitored by the sensors.

FIG. 1 illustrates a plan view of a data center storage space 10 including a server cabinet occupancy status monitoring system in accordance with one or more example techniques of the disclosure. Data center storage space 10, hereinafter referred to as "data center 10" with respect to FIG. 1, comprises an area of a building or other type of industrial or commercial structure that is further enclosed within the building or structure by a set of walls 11. The area enclosed within walls 11 is further divided by interior walls 12, which divide the area enclosed by walls 11 into a plurality of zones, the plurality of zones depicted by areas indicated generally by brackets 14, 16, 18, and 20. Each of the plurality of zones includes a floor space supporting a plurality of server cabinets.

For example, a first zone, which may be referred to as "ZONE 100," is generally indicated by bracket 14, and includes the floor space indicated by arrow 15. Zone 100 includes an area of floor space of data center 10 that is enclosed by a portion of the exterior walls 11 and by a portion of the interior walls 12, and is accessible, for example by a human operator or technician, through access door 13A. Zone 100 includes an areas of floor space within data center 10 that includes a plurality of server cabinets 101-106. A second zone, which may be referred to as "ZONE 200," is generally indicated by bracket 16, and includes the floor space indicated by arrow 17. Zone 200 includes an area of floor space of data center 10 that is enclosed by a portion of the exterior walls 11 and by a portion of the interior walls 12, and is accessible, for example by a human operator or technician, through access door 13B. Zone 200 includes an areas of floor space within data center 10 that includes a plurality of server cabinets 201-210. A third zone, which may be referred to as "ZONE 300," is generally indicated by bracket 18, and includes the floor space indicated by arrow 19. Zone 300 includes an area of floor space of data center 10 that is enclosed by a portion of the exterior walls 11 and by a portion of the interior walls 12, and is accessible, for example by a human operator or technician, through access doors 13C and 13D. Zone 300 includes an areas of floor space within data center 10 that includes a plurality of server cabinets 301-312. A fourth zone, which may be referred to as "ZONE 400," is generally indicated by bracket 20, and includes the floor space indicated by arrow 21. Zone 400 includes an area of floor space of data center 10 that is enclosed by a portion of the exterior walls 11 and by a portion of the interior walls 12, and is accessible, for example by a human operator or technician, through access doors 13E and 13F. Zone 400 includes an areas of floor space within data center 10 that includes a plurality of server cabinets 401-420.

As illustrated in FIG. 1, data center 10 includes four zones enclosed by walls 11 and separated from each other by interior wall 12, each zone including a different total number of server cabinets. However, this version of data center 10 as shown in FIG. 1 is intended to be illustrative, and not intended to be limiting. Data center 10 in various examples may include more or less zones than depicted in FIG. 1. In some examples, the number of zones included in data center 10 may be hundreds of zones, or a thousand or more zones. In addition, the number of server cabinets located within a zone of data center 10 is not limited to a particular number, and may be a same number of server cabinets or a different number of server cabinets included in a given zone relative to any other zone of data center 10.

Further, server cabinets 101-106, 201-210, 301-312, and 401-420 are illustrative, and are not limited to any particular type of cabinets, and may comprise any combination of cabinets, and/or mounting racks, and/or card cages that are configured to house, power, and/or maintain temperature control for various types of electronic devices mounted into the slots or other physical mechanisms provided in these server cabinets for receiving various types of electrical components. Although the term "server cabinet" or "server cabinets" is used in referring to the cabinets illustrated in FIG. 1 and throughout this disclosure, the cabinets and/or mounting racks and/or card cages as provided in a data center, such as data center 10, and that may utilize the devices, systems, and method described in this disclosure and the equivalents thereof, are not limited to cabinets, racks, or card cages that house only servers or server components, and my include cabinets and/or mounting racks and/or card cages configured to house other types of electrical equipment that may be mounted into the cabinets and/or mounting racks and/or card cages provides in a data center.

Because the various electronic devices that may be housed in the server cabinets included in data center 10 often generate heat when operating to perform their various functions, maintaining the level of the temperature within a zone of the data center 10 can be a critical factor in achieving reliability of both the electronic devices themselves and the reliability of overall operations being provided by the electronic devices. Temperatures above a certain level within a zone may have a negative impact on the reliability of the electronic devices, for example causing a shutdown or failure of the electronic device itself, or affecting reliability, for examples lowering the speed of operation of the electronic devices in performing their intended functions. Because of these potential issues related to temperature, customers who may own, lease, or otherwise pays for the use of the electrical equipment located within some portion or all of a data center, such as data center 10, may require the operator of the data center to provide and maintain a level of temperature control in the areas where that particular customer's equipment resides within the data center 10.

For example, a customer may own, lease, or otherwise pay for the use of all the electrical equipment included within a given zone of data center 10, for example zone 100 of data center 10. The customer may require that the operator of data center 10 maintain cooling of the customer's equipment within the customer's zone, such as zone 100, where the customer's electrical equipment resides. The customer may in some instances set a maximum temperature level that must not be exceeded, or dictate a tiered set of ranges of temperatures that must be maintained within the zone or zones where the customer's equipment resides. In various examples, the rate charged to the customer for the operation and maintenance of the customer's equipment within the data center may be dependent on complying with the requirements imposed by the customer regarding temperatures to be properly maintained in the zone or zones of the data center where the customer's equipment resides. The operator of data center 10 is often responsible for the proper maintenance of temperatures within various zones of the data center, and there may be penalties, such as financial fines or withholding of payments to the data center operator imposed by the customers if these temperature requirements are not met and maintained. Further, damage to and failure of equipment caused by overtime by result in addition costs, for example time a parts cost to diagnose and replace failed equipment, and in the potential lost revenues due to system downtime that may occur when equipment shuts down or fails due to overheating. Regardless of any customer requirements, probability and overall cost associated with operation of the data center may be adversely affected by inefficient cooling of the data center. Thus, the ability to maintain and control the temperatures at the required levels within the zones of the data center 10 may be important with respect to meeting customer requirements and for overall cost efficiency in operating the data center.

In order to control temperatures within data center 10, and in particular with a given zone of data center 10, a cooling system is installed in the data center that allows in some instances cooling of the data center 10 in general, and in various example individual control of the cooling within one or more of the zones within the data center. Cooling is often provided by a flow of cooled air delivered to a cold aisle next to the server cabinets that are to be cooled. The flow of cooled air may be provided to the cold aisle through perforated floor panels within the cold air aisle, or for example by a system of overhead cold-air ducts and vents that may be controlled to provide cold air to the cold aisle from a cold air source. In addition, server cabinets within the data center may be configured so that heat-generating electronic devices located within the server cabinets take in the cooling air from the adjacent cold aisle to cool the electronic devices, and expel the heated air generated by the cooling of the electronic devices out a back side of the server cabinets. The back side of the server cabinets may be further enclosed within a zone of the data center to form one or more hot aisles. The hot aisles may be enclosed to segregate the hot aisle from the remaining portions of the zone to prevent the heated air from reaching the cold aisle and other portions of the zone. Further, the hot aisles may be ventilated to remove the hot air by creating an air flow that exits the hot aisle, and is therefore removed for the zone of the data center 10 coupled to the hot aisle. The removed hot air flowing out of the hot aisle may simply be expelled from the data center 10, or may be further processed, for example by cooling the air, to be reused by recirculating the now cooled air to the cold aisle once the of the hot air had been cooled to a temperature level required for providing cooling air to the server cabinets along the cold aisles.

By way of example, zone 100 of data center 10 includes a cold aisle generally indicated by arrow 22A. Cold aisle 22A extends to a front side of server cabinets 101, 102, and 103, generally indicated by arrow 108, and to a front side of server cabinets 104, 105, and 108, generally indicated by arrow 109. Cooling air provided to cold aisle 22A is available for intake and cooling of electronic devices mounted in each of server cabinets 101-106. In addition, zone 100 includes as a pair of hot aisles, 23A, 23B. Hot aisle 23A extends along the backside (opposite side of front side 108) of server cabinets 101, 102, and 103, and is further closed off from the remaining portions of zone 100 by access door 24A. Hot aisle 23A is configured to receive flows of hot air, generally indicated by arrow 25, provided as heated air generated by the operation of the electrical equipment mounted in server cabinets 101, 102, and 103. Hot aisle 23A further comprises additional walls and/or ductwork (not specifically shown in FIG. 1) that prevent heated air received from the back sides of cabinets 101, 102, and 103 from reaching the other portions of zone 100, including cold aisle 22A. In various examples, hot aisle 23A further comprises additional structures that allow for the removal of the heated air received in hot aisle 23A, to be expelled or cooled and recirculated within data center 10 as described above.

In a similar manner, a second hot aisle 23B is constructed along a backside (the side opposite front side 109) of server cabinets 104, 105, and 106. Hot aisle 23B is isolated from the remainder of zone 100, for example by access door 24B, and additional structure or ductwork (not specify shown in FIG. 1). Hot aisle 23B is further configured to receive heated air generated by operation of electronic devices mounted in server cabinets 104, 105, 106, and to prevent the heated air from reaching the remaining portions of zone 100, including cold aisle 22A. In various examples, hot aisle 23A is further includes additional structures that allow for the removal of the heated air received in hot aisle 23B, to be expelled or cooled and recirculated within data center 10 as described above.

Use of the cold aisle 22A to provide cooling air to the electronic devices mounted in server cabinets 101-106, and use of the hot aisles 23A, 23B to isolate and remove hot air generated by the devices operating in server cabinets 101-103 and 104-106, respectively, helps allow for efficient maintenance of a temperature within zone 100 of data center 10. This can help the data center provider to adhere to customer service level agreement (SLA) terms defining temperature requirements. In addition, because zone 100 is further isolated from other zones within data center 10 by internal walls 12, a specific temperature requirement dictated for example by a customer who owns, leases, or pays for the use of the electrical equipment located within zone 100 can be maintained, monitored, and regulated separately and without necessarily being associated with the temperature requirement of any other zone or zones within the data center.

In various examples the electronic devices mounted in the server cabinets are configured to receive the cold air for the cold aisle at a front side 109 of the server cabinets, cool the electronic equipment, and expel the hot air toward the back side of the server cabinets. In many instances, a server cabinet, such as server cabinet 103, will include one or more slots that are not occupied by an electronic device or by a blanking cover for each of the one or more slot. These "open" or "unoccupied" slots may provide a path for heated air, generally indicated by arrow 26, to exit a server cabinet, such as server cabinet 103, and mix with, and thus contaminate the cooled air provide at cold aisle 22A with heated air. This mixing and contamination of the cooled air can cause an increased need to provide additional and/or colder air at cold aisle 22A to maintain the required temperate level at any given time within zone 100. This mixing/contamination of the cooling air provided at cold aisle 22A may result in a decrease in the efficiency of the cooling of zone 100, and may also add to the overall cost of operating the data center 10. In some examples of the mixing of the cooling air provided at cold aisle 22A with the heated air exiting one or more unoccupied slots of the server cabinets may occur to an extent that prevents the regulation of the temperature of zone 100 from being maintained at the required level, and thus may cause equipment overheating and/or equipment failure of the electrical equipment housed in the server cabinets, and/or financial penalties levied by the customer as a result of not maintaining the required temperatures and/or as a result of a customer's equipment failures or system downtimes resulting from the overtemperature conditions in the zone or zones of the data center where the customer's equipment is being housed and operated. In various examples, sensors provided on each slot of the server cabinets 101-106 may be monitored to determine the occupancy status of each cabinet and each slot of each cabinet using various techniques described in this disclosure.

In a manner similar to that described above with respect to zone 100, the additional zones (200, 300, and 400) of data center 10 may be arranged to include cold aisles that provide cooling air to a front side of the server cabinets within the zone, and hot aisles that receive and remove hot air generated by the operation of the electronic devices mounted in the server cabinets.

For example, zone 200 encloses an area of data center 10 generally indicated by arrow 17, and includes a cold aisle 22B arranged to provide cooling air to a front side of server cabinets 201-210. Hot aisle 23C is configured to enclose a back side of server cabinets 201-205, and hot aisle 23D is configured to enclose a back side of server cabinets 206-210, including access doors generally indicated as access doors 24 that allow access to the hot aisles while maintaining the separation of the hot aisles when the access doors are closes. Any unoccupied slots in server cabinets 201-210 may allow heated air from the server cabinets having the unoccupied slots to circulate into the cold aisle 22B instead of being received in one of the hot aisles 23C, 23D, thus decreasing the cooling efficiency of zone 200. In various examples, sensors provided on each slot of the server cabinets 201-210 may be monitored to determine the occupancy status of each cabinet and each slot of each cabinet using various techniques described in this disclosure.

Zone 300 encloses an area of data center 10 generally indicated by arrow 19, and includes cold aisles 22C and 22D arranged to provide cooling air to a front side of server cabinets 301-306 and 307-312, respectively. Hot aisle 23E is configured to enclose a back side of server cabinets 301-303. Hot aisle 23F is configured to enclose a back side of server cabinets 304-309. Hot aisle 23G that is configured to enclose a back side of server cabinets 310-312. Each of the hot aisles includes one or more access doors, generally indicated as access doors 24, that allow access to the hot aisles while maintaining the separation of the hot aisles when the access doors are closes. Any unoccupied slots in server cabinets 301-312 may allow heated air from the server cabinets having the unoccupied slot(s) to circulate into the cold aisle 22C and/or 22D instead of being received into one of the hot aisles 23E, 23F or 23G thus decreasing the cooling efficiency of zone 300. In addition, the unoccupied slots are openings through which hot air from the hot aisles can leak into the cold aisles. In various examples, sensors provided on each slot of the server cabinets 301-312 may be monitored to determine the occupancy status of each server cabinet and each slot of each server cabinet using the various techniques described in this disclosure.

Zone 400 encloses an area of data center 10 generally indicated by arrow 21, and includes cold aisles 22E and 22F arranged to provide cooling air to a front side of server cabinets 401-410 and 411-420, respectively. Hot aisle 23H is configured to enclose a back side of server cabinets 401-405. Hot aisle 23J is configured to enclose a back side of server cabinets 406-415. Hot aisle 23K that is configured to enclose a back side of server cabinets 416-420. Each of the hot aisles includes one or more access doors, generally indicated as access doors 24, that allow access to the hot aisles while maintaining the separation of the hot aisles when the access doors are closes. Any unoccupied slots in server cabinets 401-420 may allow heated air from the server cabinets having the unoccupied slot(s) to circulate into the cold aisle 22E and/or 22F instead of being received into one of the hot aisles 23H, 23J or 23K, thus decreasing the cooling efficiency of zone 400. In various examples, sensors provided on each slot of the server cabinets 401-420 may be monitored to determine the occupancy status of each server cabinet and each slot of each server cabinet using the various techniques described in this disclosure.

Examples of data center 10 as described in this disclosure provide monitoring of a status related to whether each of the server cabinets provide in data center 10 are "fully occupied" or instead have one or more slots of the server cabinet that are not occupied by at least one of an electronic device or a blanking cover filling the area of the slot at the front face of the server cabinet. The blanking cover, when installed in the front face of a slot of a server cabinet, is configured to block substantially any flow of air from exiting out from the front face of the server cabinet through the slot covered by the blanking cover. As further described below (e.g., with respect to FIG. 3), each of the server cabinets included in a zone, such as zone 100 in FIG. 1, comprise a set of sensors configured to detect whether each slot in a server cabinet is occupied by either an electronic device or a blanking cover. This information regarding the occupancy status of a server cabinet in some examples is transmitted, either wirelessly and/or through wired connections, such as data lines, to monitoring circuitry 110. This transmission of data from zone 100 (and other zones in data center 10) is illustratively represented by lightning bolt 112, and represents coupling of the signals or other status information derived from the sensor on the server cabinets to monitoring circuitry 110.

Monitoring circuitry 110 in some examples comprises communication circuitry configured to receive the signals and/or data provided from the server cabinets, process that signals and/or data using processing circuitry, and provide one or more outputs, for example a graphical display, that may be display on a display device 111, that illustrates information related to the occupancy statuses of the server cabinets being monitored by the sensors. This occupancy statuses may in some examples be provided by monitoring circuitry 110 to a network 114. Network 114 may be coupled to a database 115 where this information received from monitoring circuitry 110 may be stored. Analysis of the received statuses and data provided by the sensors at monitoring circuitry 110 may be processed at monitoring circuitry 110, and/or by other devices coupled to network 114. For example, a customer having equipment housed and operating within data center 10 may access and/or process the signals and/or other data, for example using an external device 116, to view and or determine the occupancy statuses of the server cabinets where the customer's equipment is housed and operated through access to database 115 and/or network 114. As such, customers or other parties having the rights to access the information provided by the monitoring of the occupancy statuses of data center 10 may access this information using external devices 116. External devices 116 are not limited to any particular types of devices, and may include computers, laptop computers, electronic personal digital assistance devices, and/or mobile electronic devices such as cellular phones, for example.

In various examples statuses and other information may be provided directly from one or more of the sensors and/or one or more the server cabinets to the network 114, as illustratively represented by lightning bolt 113. Communications illustratively represented by lightning bolt 113 may be in addition to or instead of communications provided to network 114 by monitoring circuitry 110, or may be used in place of the outputs provided to monitoring circuitry 110.

In addition, one or more internal devices 118 may be included as part of the monitoring circuitry 110 used to monitor the occupancy statuses of the server cabinets within data center 10. Internal devices are not limited to any particular types of devices, and may include computers, laptop computers, electronic personal digital assistance devices, and/or mobile electronic devices such as cellular phones, for example. The internal devices are examples of devices that may be used within data center 10, for example by a technician, while moving throughout the data center, and that allow the user to continue to monitor and view information related to the occupancy statuses of the server cabinets within the data center as the user moves throughout the data center.

Figure 2:
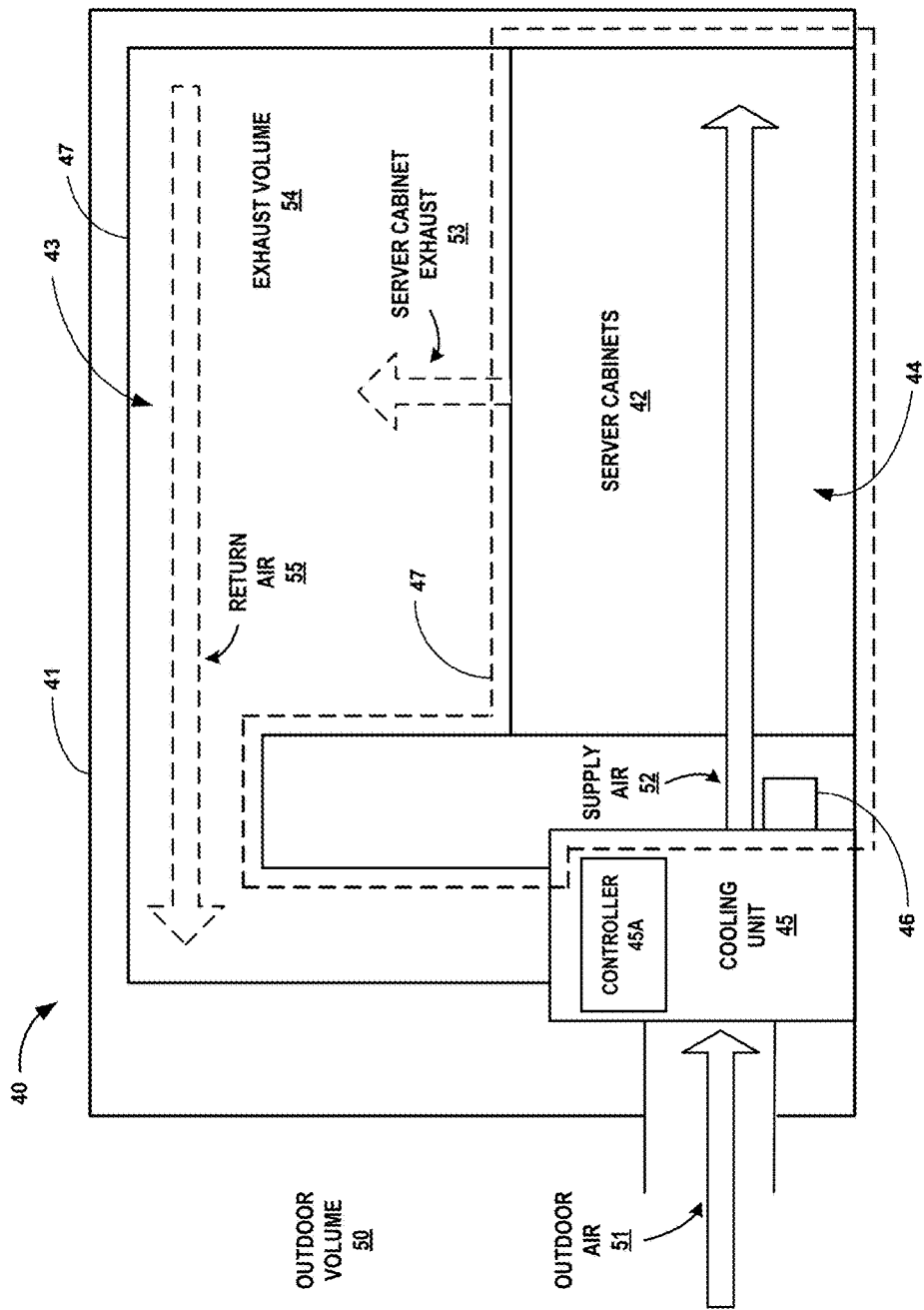
FIG. 2 illustrates a side cross-sectional view of a portion of the data center storage space of FIG. 1, in accordance with one or more example techniques of the disclosure.

FIG. 2 is a block diagram 40 that illustrates a more detailed view of a storage volume 41 of the data center 10 of FIG. 1, in accordance with one or more techniques of the disclosure. Storage volume 41 of data center 10 includes a plurality of server cabinets 42 located within storage volume 41. Server cabinets 42 as illustrated in FIG. 2 may be illustrative of any of number the server cabinets illustrated and described with respect to FIG. 1. As illustrated in FIG. 2, the storage volume 41 includes one or more cold aisles 44 enclosing a portion of the server cabinets 42, including a front side of the server cabinets 42. Storage volume 41 further includes one or more hot aisles 43 that are physically separated, for example by structure 47 (e.g., walls, access doors and/or ductwork), with respect to air flows from the cold aisles 44, the hot aisles configured to enclose a back side of server cabinets 42.

A cooling unit 45 is physically coupled to storage volume 41 to receive air flows from and to provide air flows to storage volume 41. Cooling unit 45 may include an outdoor air intake 51 coupling the cooling unit 45 to an outdoor volume 50 of air, a return air intake 55 coupling the cooling unit 45 to an exhaust volume 54 of air provided by the back side of server cabinets 42, and a supply air output 52 coupling the cooling unit 45 with the cold aisles 44 of the storage volume 41. Cooling unit 45 may include one or more air dampers (not specifically shown in FIG. 2), such as an outdoor air damper that controls the amount of air flow received at outdoor air intake 51 from the outdoor volume 50, and a return damper that controls the amount of air flow received from return air intake 55 from exhaust volume 54.

Cooling unit 45 in various examples includes a controller 45A. Controller 45A in various examples is configured to monitor one or more cooling unit sensors 46 coupled to cooling unit 45, and using signals provided by sensors 46, to control the operations of cooling unit 45. Controlling the operations of cooling unit 45 may include, for example, controlling the states of outdoor air damper and return air damper to adjust the respective proportions of the incoming outdoor air received at outdoor air intake 51 and return air received at return air intake 55 by adjusting positions of the respective outdoor air damper and return air damper. In some examples, the outdoor air damper is completely closed when cooling unit 45 is in mechanical mode, and the outdoor damper may be least partially open when cooling unit 45 is in economizer mode.

When operating to control the temperature of storage volume 41, cooling unit 45 receives return air at return air intake 55 that may be heated by operation of electronic devices mounted in the server cabinets 42, and, based on control input provided by controller 45A, generates the flow of supply air provided at supply air output 52 being returned to the storage volume 41. Returning the flow of supply air to storage volume 41 may include mixing the return air with outdoor air provided at outdoor air intake 51, cooling the air to be provided as the supply air, and/or adjusting the level of humidity in the air to be returned as the supply air. In addition, the fan array of cooling unit 45 may adjust one or more fan speeds to increase or decrease or the flow rate of the supply air being returned to the storage volume 41.

More or less cooling may be required of the cooling unit 45 depending on the current operating state of storage volume 41, wherein the current operating state may be determined at least in part by signals provided by one or more of sensors 46. For example, depending on the temperature of air entering the cooling unit 45, including return air received at return air intake 55 and/or outdoor air received at outdoor air intake 51, more or less cooling may be required. In addition, if one or more of the slots of server cabinets 42 are not occupied, as described above, heated air that would normally be received as server exhaust air 53 and provided as return air may instead exit the server cabinet 42 through the one or more unoccupied slots, and thus mix with and contaminate the supply air being provided to the front side of the server cabinets 42. This unintended mixing of the supply air may reduce the efficiency of the overall cooling of storage volume 41. For example, the heated air exiting the one or more unoccupied slots in the server cabinets 42 is not available as part of the exhaust volume that may be returned to cooling unit 45, and may instead heat the supply air provided to the front side of the server cabinets. This heated air may then reenter the server cabinets and flow over the electronic devices mounted in the server cabinets, but may fail to provide the cooling expected based on the temperature of the supply air original provided to the server cabinets.

The recirculation of this warmed air to the server cabinets may reduce the overall efficiency of the cooling of the storage volume 41, resulting in increased costs to maintain the required temperatures with storage volume 41. If the proper temperate cannot be maintained, even if the over-temperature conditions only exist for a short period of time, the conditions may result in cost penalties levied by the customer as described above. In addition, the recirculation of this heated air may cause one or more of the electronic devices mounted in server cabinets 42 to overheat and/or fail, resulting in loss of that device and the possibility of overall shutdown of the service being provided at least in part by that device, which may again result in a cost penalty levied against the operator of the storage volume or against the operator of the data center, or actual lost revenue for the customer who owns, leases, or other uses the serves provided by the failed electronic devices residing in the data center due to the shutdown of their system.

The systems, devices, and techniques described in this disclosure for monitoring the occupancy status of server cabinets having electronic devices mounted and operating within the storage volume of a data center provide capabilities that allow real-time monitoring of the occupancy statuses to these server cabinets, and provide various tools and techniques to allow a user to quickly determine if and where any unoccupied slots exist in the monitored server cabinets. These monitoring tools allow persons, such as customers and persons operating a data center, to conveniently monitor the occupancy statuses over many server cabinets. The ability to quickly locate issues related to unoccupied slots and other issues in the monitored server cabinets so that appropriate measures may be taken to avoid overheating and other related problems that may be caused by these unoccupied slots may provide various reliability and cost benefits for the operating of the data centers utilizing these monitoring techniques described in this disclosure.

Figure 3:
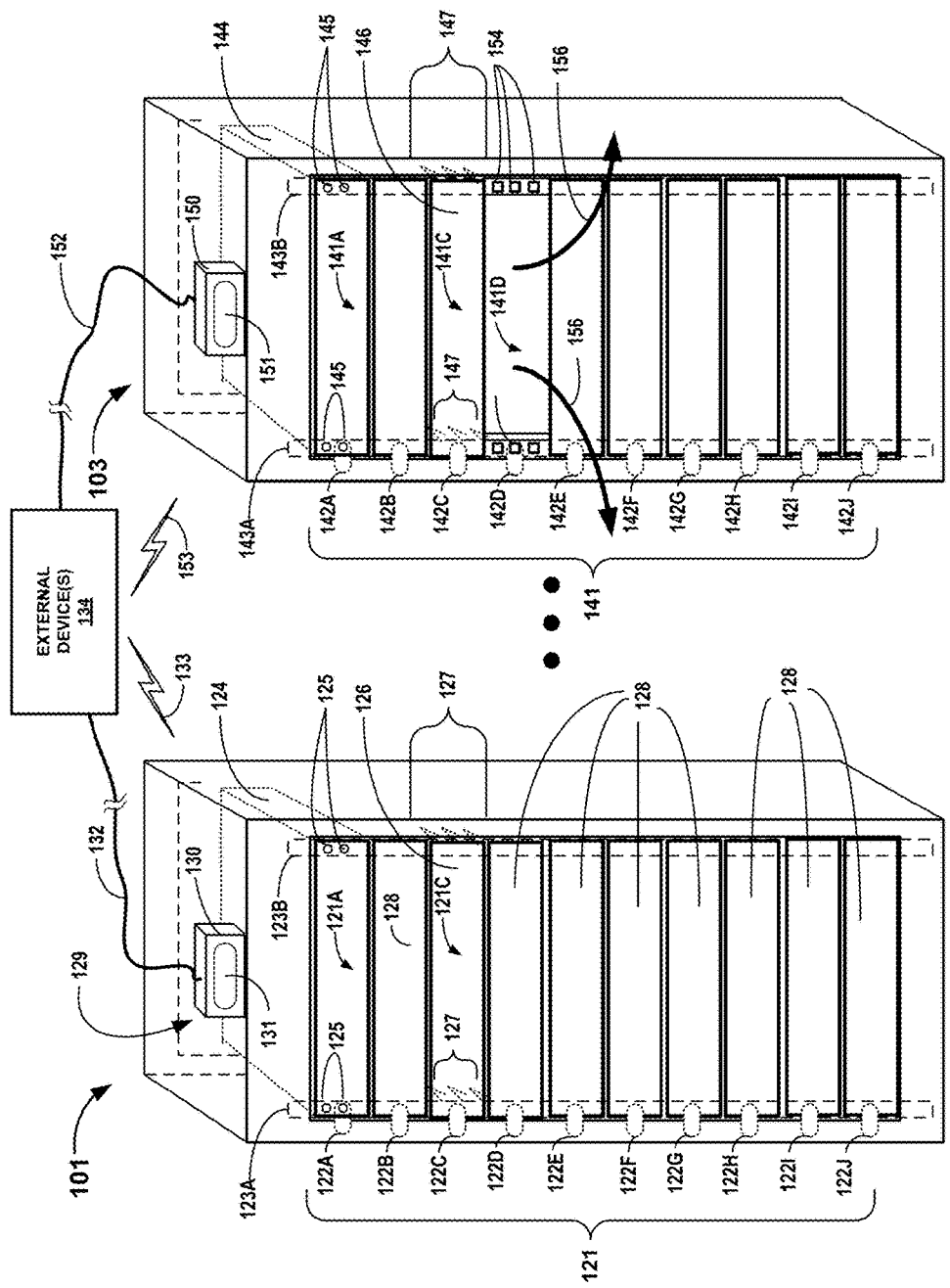
FIG. 3 illustrates a plurality of server cabinets configured to monitor an occupancy status of each server cabinet in accordance with one or more example techniques of the disclosure.

FIG. 3 illustrates a plurality of server cabinets 101, 103 configured to monitor occupancy statuses of each server cabinet in accordance with one or more example techniques of the disclosure. As illustrating in FIG. 3, a zone 120 includes a plurality of server cabinets comprising at least server cabinets 101 and 103. Additional server cabinets may be included in zone 120, as represented by the dots between server cabinets 101 and 103 illustrated in FIG. 3.

Server cabinet 101 (hereinafter referred to as "cabinet 101" with respect to FIG. 3) includes a plurality of slots, generally indicated as slots 121, arranged in horizontal rows along the vertical dimension of cabinet 101. Cabinet 101 further comprises a pair of mounting rails 123A, 123B, affixed to a front portion of cabinet 101, and configured with openings (not specifically shown for the mounting rails 123A, 123B), that allow one or more fastening devices to be received in these openings for mounting and securing an electronic device or a blanking cover that may be received at each of the slots 121. Cabinet 101 as illustrated in FIG. 3 includes a plurality of sensors 122A-122J, each of the sensor 122A-122J positioned at one of slots 121, and configured to detect whether the slot where the sensor is located is occupied by either an electronic device or a blanking cover, as further described below. Sensors 122A-122J are configured to provide a sensor output signal that is indicative of whether at least one of an electronic device or a blanking cover occupies the slot where each sensor, respectively, is located. The signals provided by sensors 122A-122J may be monitored by one or more external devices 134, such as the monitoring circuitry 110 of FIG. 1, or by a cabinet monitoring circuitry 130 provided with cabinet 101. The signal provided by sensors 122A-122J may be monitored by other devices, and processed to determine an occupancy status for each of the slots 121 included in cabinet 101, and further processed to determine an overall occupancy status associated with cabinet 101. In some examples, these occupancy statuses for the slots 121 of cabinet 101 are determined substantially in real-time based on the rate at which the sensor signals are provided by and/or are polled by monitoring circuitry or other devices from sensors 122A-122J.

The output signals generated by sensors 122A-122J may in some examples be received by monitoring circuitry 130 that in some examples is physically located at cabinet 101. Monitoring circuitry 130 may receive the sensor output signals either wireless transmissions from sensors 122A-122J, or by a wired connection from each of sensors 122A-122J. In various examples, monitoring circuitry 130 includes a display device 131, comprising visual indicators such as indicator lights, light-emitting-diodes (LEDs), and/or a graphical display screen that is configured to display graphical information related to the occupancy statuses determined by the signals received from sensors 122A-122J. For example, display device 131 may include indicator lights, each indicator light associated with one of slots 121, and configured to illuminate (or in the alternative to illuminate with a different color) when the sensor of sensors 122A-122J located at a slot 121 of cabinet 101 provides an output signal indicating that the slot associated with the sensor is not occupied. In various examples, the indicator lights may be LEDs.

In another example, display device 131 provides a visual indication of an overall occupancy status for cabinet 101 based on the output signals provide by all of sensors 122A-122J, for example using an indicator light or an LED. In various examples, display device 131 includes a graphical display that is configured to display information indicative of the occupancy status(es) of one or more of slots 121 and/or the overall occupancy status of cabinet 101 based on the output signals received from sensor 122A-122J.

In various examples, monitoring circuitry 130 includes an output, illustratively represented as output line 132, that is configured to provide cabinet output signals indicative of the occupancy statuses of cabinet 101. These cabinet output signals may include signals and/or data based on and/or determined from the output signals provided by sensors 122A-122J, to external devices 134. In other examples, sensors 122A-122J transmit the generated sensor output signals wirelessly, illustratively represented by lightning bolt 133 in FIG. 3, to one or more external devices 134 located remotely from cabinet 101. These wirelessly transmitted signals may then be received and processed by the one or more external devices 134 to determine occupancy statuses of slots 121 of cabinet 101, and/or an overall occupancy status associated with cabinet 101. In other example, the occupancy statuses associated with cabinet 101 may be transmitted to the one or more external devices 134 from monitoring circuitry 130 through line 132. In some examples, line 132 is a wired connection, such as a 2-wire data bus. In other examples, line 132 is a wireless connection, such as a WiFi, Bluetooth, or some other type of wireless connection.

In a similar manner, server cabinet 103 (hereinafter referred to as "cabinet 103" with respect to FIG. 3) includes a plurality of slots, generally indicated as slots 141, arranged in horizontal rows along the vertical dimension of cabinet 103. Cabinet 103 further comprises a pair of mounting rails 143A, 143B, affixed to a front portion of cabinet 103, and configured with openings (for example openings 154 shown for the mounting rails 143A, 143B), that allow one or more fastening devices to be received in these openings for the purpose of mounting and securing an electronic device or a blanking cover that may be received at each of the slots 141.

Cabinet 103 as illustrated in FIG. 3 includes a plurality of sensors 142A-142J, each of the sensor 142A-142J positioned at one of slots 141, and configured to detect whether the slot where the sensor is located is occupied by either an electronic device or a blanking cover, as further described below. Sensors 142A-142J are configured to provide an output signal that is indicative of whether at least one of an electronic device or a blanking cover occupies the slot where each sensor, respectively, is located. The signals provided by sensors 142A-142J may be monitored by other devices, such as the monitoring circuitry 110 of FIG. 1 or a cabinet monitoring circuitry 150 provided with cabinet 101. The signals provided by sensors 142A-142J may be monitored by one or more external devices 134, such as the monitoring circuitry 110 of FIG. 1, or by a cabinet monitoring circuitry 150 provided with cabinet 103. The signal provided by sensors 142A-142J may be monitored by other devices, and processed to determine an occupancy status for each of the slots 121 included in cabinet 101, and further processed to determine an overall occupancy status associated with cabinet 101. In some examples, these occupancy statuses for the slots 121 of cabinet 103 are determined substantially in real-time based on the rate at which the sensor signals are provided by and/or are polled by monitoring circuitry or other devices from sensors 142A-142J.

The output signals generated by sensors 142A-142J may in some examples be received by monitoring circuitry 150 that in some examples is physically located at cabinet 103. Monitoring circuitry 150 may receive the signal either wireless transmitted from sensors 142A-142J, or by a wired connection from each of sensors 142A-142J. In various examples, monitoring circuitry 150 includes a display device 151, comprising visual indicators such as indicator lights, light-emitting-diodes (LEDs), and/or a graphical display screen that is configured to display graphical information related to the occupancy statuses determined by the signals received from sensors 122A-122J. In various examples, monitoring circuitry 150 and 151 are configured to provide all of the functions described above with respect to monitoring circuitry 130 and display device 131, respectively, but based on the output signals received from sensors 142A-142J and in association with the occupancy status(es) of cabinet 103.

In various examples, monitoring circuitry 150 includes an output, illustratively represented as output line 152, that is configured to provide cabinet output signals indicative of the occupancy statuses of cabinet 103. These cabinet output signals may include signals and/or data based on and/or determined from the output signals provided by sensors 142A-142J, to external devices 134. In other examples, sensors 142A-142J transmit the generated sensor output signals wirelessly, illustratively represented by lightning bolt 153 in FIG. 3, to one or more external devices 134 located remotely from cabinet 101. These wirelessly transmitted signals may then be received and processed by the one or more external devices 134 to determine occupancy statuses of slots 141 of cabinet 103, and/or an overall occupancy status associated with cabinet 103. In other examples, the occupancy statuses associated with cabinet 103 may be transmitted to the one or more external devices 134 from monitoring circuitry 150 through line 152. In some examples, line 152 is a wired connection, such as a 2-wire data bus. In other examples, line 152 is a wireless connection, such as a WiFi, Bluetooth, or some other type of wireless connection.

By way of further illustration of the monitoring features provided by the examples illustrated in FIG. 3, the top slot 121A of cabinet 101 is shown as having received an electronic device 124 that is fully received and is secured to cabinet 101 at slot 121A. Electronic device 124 may be secured to cabinet 101 using fasteners 125 that are fastened to both mounting rails 123A and 123B. Electronic device 124, when fully received and secured at slot 121A, is said to "occupy" slot 121A, and slot 121A is considered to be "occupied" by electronic device 124. In another example, slot 121C of cabinet 101 (the third slot down from the top of cabinet 101) is shown having received a blanking cover 126 at slot 121C. Blanking cover 126 may be secured to cabinet 101 using tangs 127 that are provided as part of blanking cover 126, and that are configured to extend into the opening of mounting rails 123A and 123B to fasten and secure blanking cover 126 to the mounting rails 123A and 123B, and thus to the opening of slot 121C when blanking cover 126 is fully received at slot 121C. Blanking cover 126, when fully received and secured at slot 121C, is said to "occupy" slot 121C, and slot 121C is "occupied" by blanking cover 126. As illustrated in FIG. 3, each of the slots 121 illustrated for cabinet 101 is occupied either by an electronic device similar to electronic device 124, or by a blanking cover similar to blanking cover 126. These additional devices and/or blanking covers are generally indicated by reference number 128 in FIG. 3. Sensors 122A-122J are configured to detect the presence of these devices or covers, and to provide output signals indicating that each of slots 121 of cabinet 101 is occupied.

As illustrated in FIG. 3, each of the slots 121 of cabinet 101 have received either an electronic device or a blanking cover at each of the slots 121, and therefore is referred to as being "fully occupied," because each slot in the cabinet is "occupied." This status of being "fully occupied" is important because by being fully occupied, any heat generated by electronic devices, such as electronic device 124, or devices at other slots 121 of cabinet 101, and hot air available from the back side of cabinet 101 generated by devices at other cabinets will substantially be forced to exit cabinet 101 through an external opening, generally indicated by opening 129, at the back side of cabinet 101. Opening 129 may be coupled to a hot aisle, for example hot aisle 23A as illustrated in FIG. 1, wherein the hot air exiting cabinet 101 through opening 129 as may then be removed and in some examples expelled from zone 120. In other examples, the hot air exiting cabinet 101 may be cooled and recirculated as cooled air to a cold aisle proving cold air to cabinet 101, such as cold aisle 22A as illustrated in FIG. 1. As shown in FIG. 3, by having cabinet 101 in a fully occupied status, the hot air generated by any of the electronic devices mounted in cabinet 101 is prevented from exiting the front side of cabinet 101 and mixing with the cold air being provided to one or more of the server cabinets located in zone 120.

By way of further illustration of the monitoring features provided by the examples illustrated in FIG. 3, cabinet 103 is shown as having received an electronic device 144 that is fully received and is secured to cabinet 103 at slot 141A. Electronic device 144 may be secured to cabinet 103 using fasteners 145 that are fastened to both mounting rails 143A and 143B. Electronic device 144, when fully received and secured at slot 141A, is said to "occupy" slot 141A, and slot 141A is "occupied" by electronic device 144. Sensor 142A is configured to detect the presence of electronic device 144 as fully received at slot 141A, and to generate and output signal indicating the slot 141A is "occupied." In another example, slot 141C of cabinet 301 (the third slot down from the top of cabinet 103) is shown having received a blanking cover 146 at slot 141C. Blanking cover 146 may be secured to cabinet 103 using tangs 147 that are provided as part of blanking cover 146, and that are configured to extend into the opening of mounting rails 143A and 143B to fasten and secure blanking cover 146 to the mounting rails 143A and 143B, and thus to the opening of slot 141C when blanking cover 146 is fully received at slot 141C. Blanking cover 146, when fully received and secured at slot 141C, is said to "occupy" slot 141C, and slot 141C is "occupied" by blanking cover 146. Sensor 142C may be configured to detect the presence of blanking cover 146 as fully received at slot 141C, and to generate an output signal indicating the slot 141C is "occupied."

In another example, slot 141D of cabinet 103 (the forth slot down from the top of cabinet 301) is shown as having not having received either an electronic device or a blanking cover. As such, slot 141D provides and opening that may allow heated air, illustratively represented by arrow 156, to exit the front side of cabinet 103 instead of exiting cabinet 013 through the opening 149 in the back side of the cabinet. In this instance, sensor 142D may be configured to detect that neither an electronic device or a blanking cover is received at slot 141D, and is configured to provide a sensor output signal indicative of the detection of an "unoccupied" status for slot 141D. The indication of an unoccupied slot may be transmitted wirelessly or by wired connection to monitoring circuitry 150, and/or wirelessly by sensor 142D to the one or more external devices 134. The indication of an unoccupied slot at cabinet 103 may cause monitoring circuitry to generate a visual indication of the detection of the unoccupied slot, and monitoring circuitry 150 may process the sensor output signal provide by sensor 142D to generate an overall occupancy status for cabinet 103 indicative of a least one unoccupied slot of slots 141 for cabinet 103.

Sensors 122A-122J and 142A-142J are not limed to any particular type of sensors, and may or may not all be comprised of a same type of sensor device. In some examples, one or more of sensors 122A-122J and 142A-142J comprise an optical detection type sensor having a transmitter portion and a receiver portion and configured to detect the present or absence of a device, such as a fastener used to secure an electronic device or a blanking cover to a slot, what a light wave transmitted from the transmitter portion to the receiver portion is blocked by the presence of the fastener. In some examples, one or more of sensors 122A-122J and 142A-142J comprises a Hall effect sensor configured to detect certain metal objects, such as fasteners and metal coating on tangs used to secure electronic devices and or blanking covers to a slot of a server cabinet. In some examples, one or more of sensors 122A-122J and 142A-142J comprise a capacitive-type sensor configured to detect certain materials such as plastics, that may be used to form the fasteners and or the tangs used to secure electronic devices and or blanking covers to a slot of a server cabinet. In some examples one or more of sensors 122A-122J and 142A-142J comprises a pressure sensor device configured to sense the presence or absence of electronic devices and or blanking covers at a slot of a server cabinet by sensing pressure provided to the pressure sensor when the electronic devices and or blanking covers are received and secured in play at slot where the pressure sensor is located.

Figure 4B:
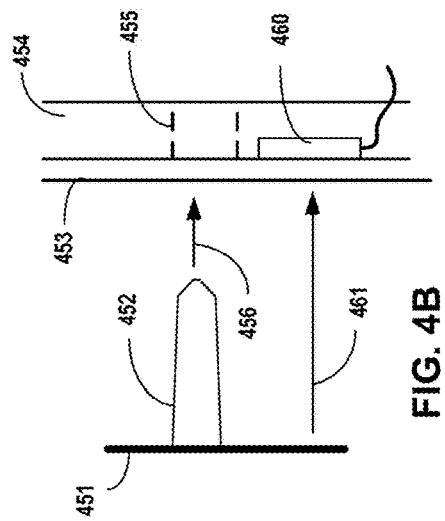
FIG. 4B illustrates use of pressure sensitive device to monitor a slot of a server cabinet in accordance with one or more example techniques of the disclosure.
Figure 4D:
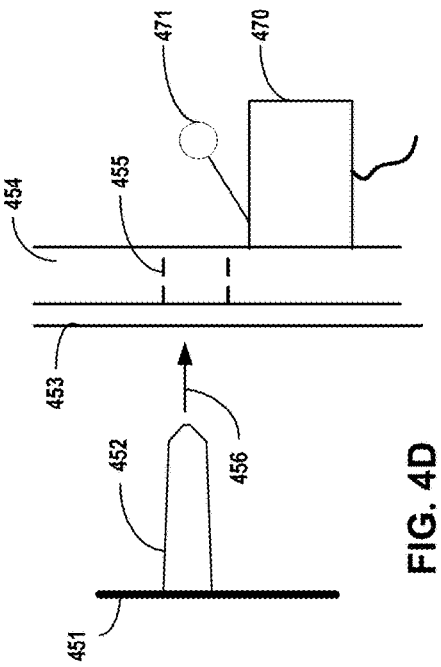
FIG. 4D illustrates use of a microswitch to monitor a slot of a server cabinet in accordance with one or more example techniques of the disclosure.
Figure 4A:
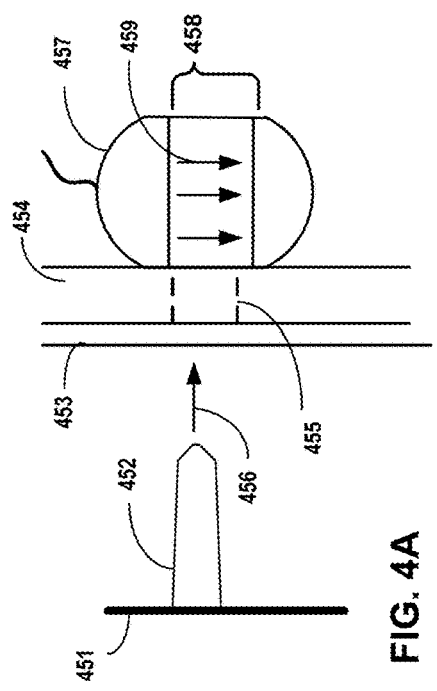
FIG. 4A illustrates use of an optical sensor device to monitor a slot of a server cabinet in accordance with one or more example techniques of the disclosure.

FIG. 4A illustrates use of an optical sensor device 457 to monitor a slot of a server cabinet in accordance with one or more example techniques of the disclosure. As illustrated in FIG. 4A, a side view of portion of a front side 453 of a server cabinet is shown located adjacent to a mounting rail 454 having an opening 455 passing through the mounting rail, the opening also adjacent to the front side 453. Opening 455 is configured to receive a fastener, such as fastener 452, that is coupled to a front panel 451 of either an electronic device or a blanking cover. Fastener 452 is configured to be inserted into opening 455 in the direction of arrow 456 so that at least a portion of fastener 452 extend through opening 455 beyond mounting rail 454 to allow front panel 451 to be brought into contact or proximity with mounting rail 454, wherein fastener 452 is configured to secure the front panel 451 to the server cabinet.

Optical sensor 457 is secured to mounting rail 454 in a position behind mounting rail 454 and adjacent to opening 455. Optical sensor 457 includes circuitry that generates a light wave, and transmits the light wave, generally indicated by arrows 459, across a transmission area 458 of the optical sensor 457. Transmission area 458 is positioned so that when no fastener is received at opening 455, optical sensor receives its own transmitted light waves at a receiver portion of the optical sensor. When fastener, such as fastener 452 is fully received at opening 455, the light waves transmitted by optical sensor 457 are blocked from being received by the optical sensor's receiver. Optical sensor 457 is configured to provide an electrical output signal that varies in some manner, for example varies in a voltage level output, based on whether the light waves of the optical sensor are being received or are being blocked. This variation in the output signal may be interpreted to determine whether either an electronic device or a blanking cover have been received at the slot of the server cabinet associated with the opening 455.

FIG. 4B illustrates use of pressure sensitive device 420 to monitor a slot of a server cabinet in accordance with one or more example techniques of the disclosure. As illustrated in FIG. 4B, this side view illustrates a portion of a front side 453 of a server cabinet, the front side 453 adjacent to a mounting rail 454 having an opening 455 passing through the mounting rail, the opening also adjacent to the front side 453. Opening 455 is configured to receive a fastener, such as fastener 452, that is coupled to a front panel 451 of either an electronic device or a blanking cover. Fastener 452 is configured to be inserted into opening 455 in the direction of arrow 456 so that at least a portion of fastener 452 extend through opening 455 beyond mounting rail 454 to allow front panel 451 to be brought into contact or proximity with mounting rail 454, wherein fastener 452 is configured to secure the front panel 451 to the server cabinet.

A pressure sensor device 420 located near the front edge of the mounting rail 454 in a position so that when fastener 452 is fully received into opening 455, the backside surface 461 of panel 451 will be brought into contact will and will exert a pressure against pressure sensor device 420, as illustratively represented by arrow 462. Pressure sensor device 420 is configured to provide an electrical output signal that varies in some manner, for example varies in a voltage level output, based on whether the pressure sensor device 460 is sensing or not sensing a pressure being applied to pressure sensor device 460. This variation in the output signal may be interpreted to determine whether either an electronic device or a blanking cover have been received at the slot of the server cabinet associated with the opening 455.

Figure 4C:
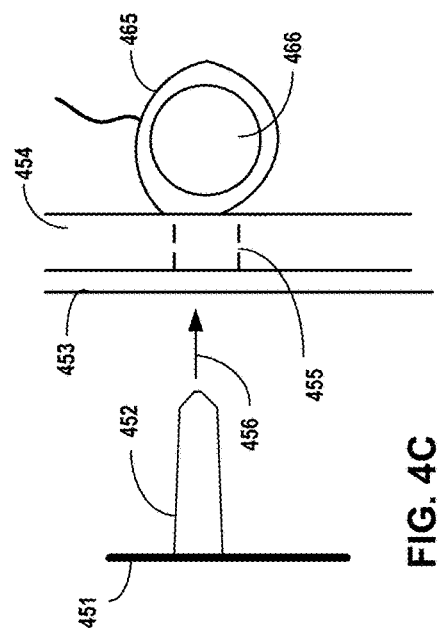
FIG. 4C illustrates use of capacitive or a Hall Effect device to monitor a slot of a server cabinet in accordance with one or more example techniques of the disclosure.

FIG. 4C illustrates use of capacitive or a Hall effect sensor device 465 to monitor a slot of a server cabinet in accordance with one or more example techniques of the disclosure. As shown in FIG. 4C, a front side 453 of a portion of a server cabinet is located adjacent to mounting rail 454 comprising an opening configured to receive fastener 452 that is physically coupled to the front panel 451 of either an electronic device or a blanking cover. Sensor device 465 is located at a position behind mounting rail 454 adjacent to and off to one side of opening 455. Sensor device is configured to sense the material of certain types when present proximate to a face portion 466 of the sensor device. In some examples, sensor device is a Hall effect sensor that may detect the presence of certain types of metals. In some examples, sensor device 465 is a capacitive type sensor device that is configured to detect certain types of materials such as plastic. The type of sensor device selected for use as sensor device 465 will correspond to the types of material or materials used for example to form fastener 452.

In various examples, then fastener 452 is fully inserted into opening 455, at least a portion of fastener 452 will be located proximate to the face portion 466 of sensor device 465, allowing sensor device 465 to detect the presence of fastener 452. Sensor device 465 is configured to provide an electrical output signal that varies in some manner, for example varies in a voltage level output, based on whether sensor device 465 is detecting the presence of fastener 452. This variation in the output signal may be interpreted to determine whether either an electronic device or a blanking cover have been received at the slot of the server cabinet associated with the opening 455.

FIG. 4D illustrates use of a microswitch 470 to monitor a slot of a server cabinet in accordance with one or more example techniques of the disclosure. As shown in FIG. 4D, a front side 453 of a portion of a server cabinet is located adjacent to mounting rail 454 comprising an opening configured to receive fastener 452 that is physically coupled to the front panel 451 of either an electronic device or a blanking cover. Microswitch 470 is located at a position behind mounting rail 454 adjacent to and below opening 455. Microswitch 470 includes a switch actuator arm 471 that extends from microswitch 470 into the area that will receive fastener 452 to an extent that will cause fastener 452 to move actuator arm to a position to actuate microswitch 470. Switch actuator arm 471 and microswitch 470 are configured to return switch actuator arm 471 to the non-actuated position when fastener 452 is removed from opening 455. Microswitch 470 is configured to provide an electrical output signal that varies in some manner, for example varies in a voltage level output, based microswitch 470 is actuated or unactuated. This variation in the output signal may be interpreted to determine whether either an electronic device or a blanking cover have been received at the slot of the server cabinet associated with the opening 455.

Figure 4E:
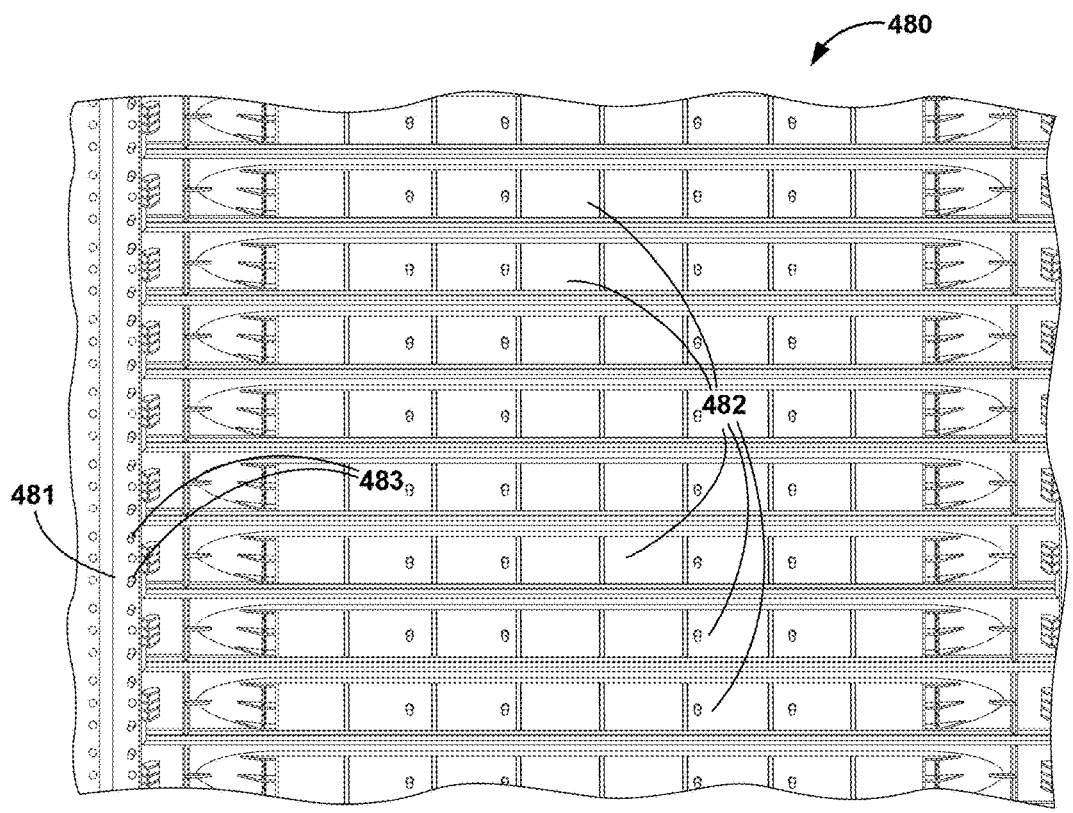
FIG. 4E illustrates a backside view of a plurality of blanking covers installed in a server cabinet in accordance with one or more example techniques of the disclosure.

FIG. 4E illustrates a backside view of a plurality of blanking covers 482 installed in a cabinet 480 in accordance with one or more example techniques of the disclosure. A portion of a cabinet 480 is shown looking from the back side and through the interior of the cabinet 480 toward the front side of the cabinet 480. A mounting rail 481 is shown located along the left side of the illustration, and is secured to the cabinet 480. A plurality of blanking covers 482 are illustrated as received and fastened into a server cabinet 480 at least by virtue of a pair of fasteners 483, indicated by reference number 483 for one blanking panel, fasteners 483 shown as extending through mounting rail 481. Any one of fasteners 483 or similar fasteners for any of blanking covers 482 may be an example of a fasten, such as but not limited to fastener 452 as shown in FIGS. 4A-D or other fastening devices that could be detected to determine if a blanking cover is installed in a slot of a cabinet, such as cabinet 480 as illustrated in FIG. 4E.

Figure 4F:
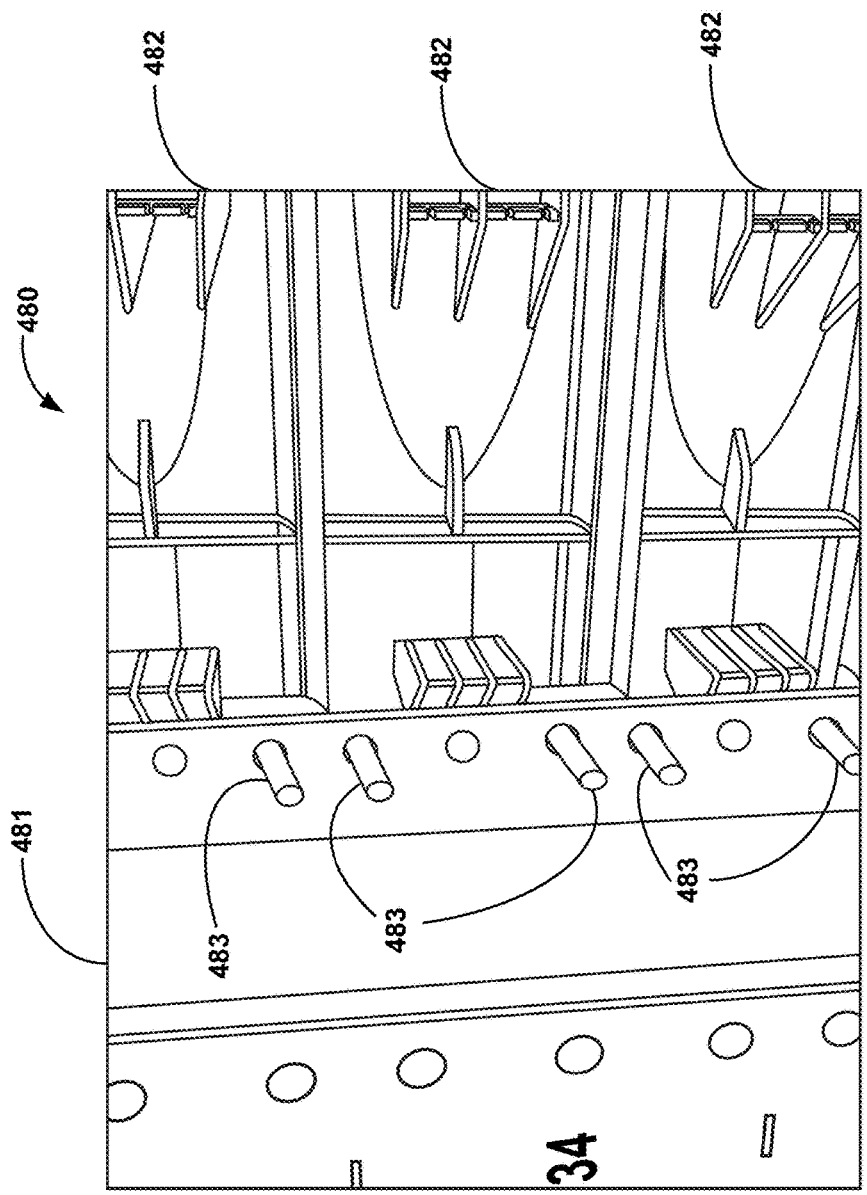
FIG. 4F illustrates a close up view of a portion of blanking covers installed in a server cabinet in accordance with one or more example techniques of the disclosure.

FIG. 4F illustrates a close-up detail view of the blanking covers 482 of FIG. 4E in accordance with one or more example techniques of the disclosure. As shown in FIG. 4F, blanking covers 482 are received and secured to the mounting rail 481 of cabinet 480 having fasteners 483 extending through opening in the mounting rail 481. Fasteners 483 are examples of the devices that could be detected by some type of sensors to detect the presence of the blanking covers 482 installed in the slots of a cabinet such as cabinet 480.

Figure 5:
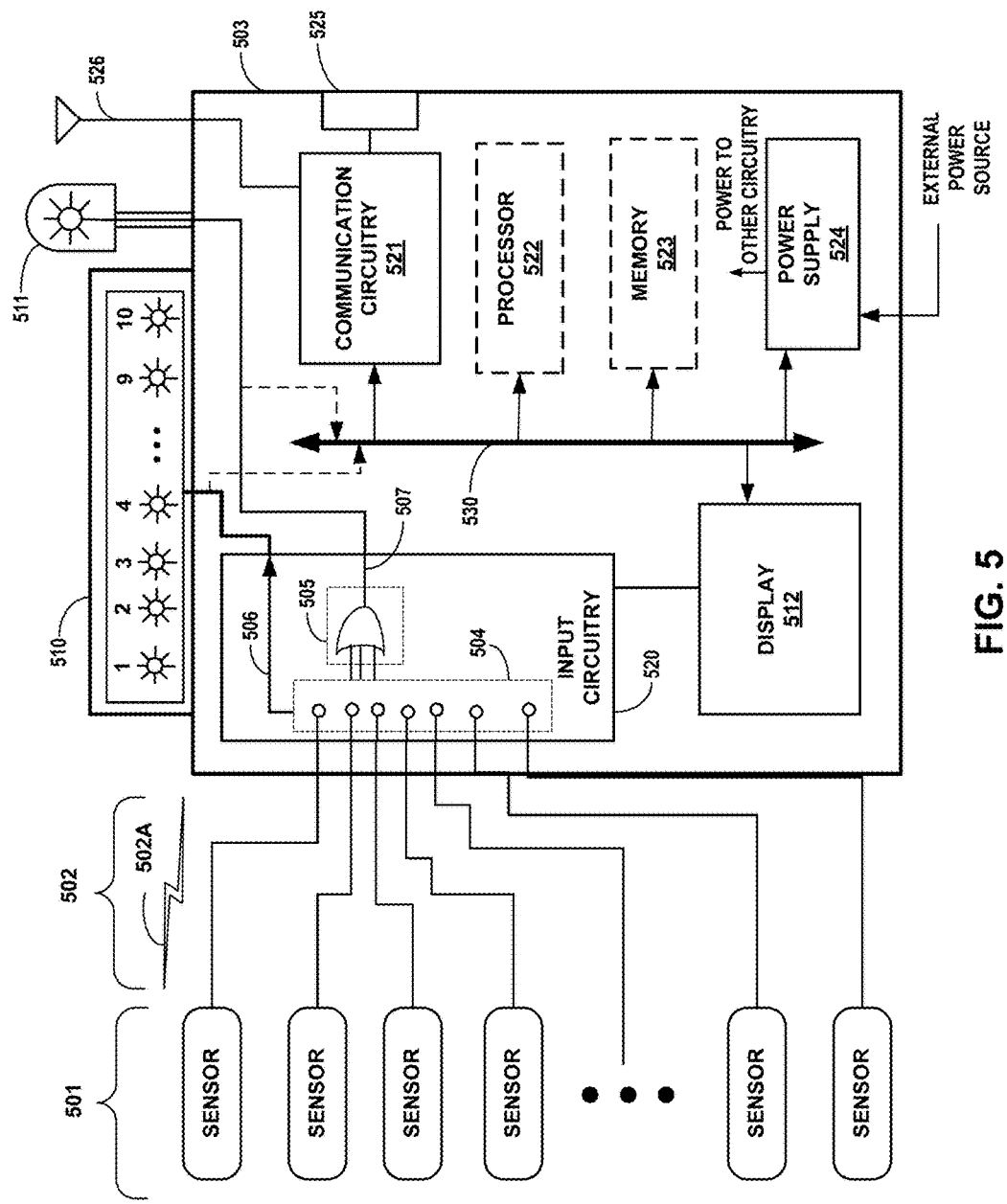
FIG. 5 illustrates a conceptual block diagram of a plurality of sensors and a cabinet monitoring circuitry of a server cabinet in accordance with one or more example techniques of this disclosure.

FIG. 5 illustrates a conceptual block diagram of a plurality of sensors 501 and a cabinet monitoring circuitry 503 in accordance with one or more example techniques of this disclosure. As illustrated in FIG. 5, a plurality of sensors 501 are coupled, as illustratively represented by coupling 502, to cabinet monitoring circuitry 503. Sensors 501 are configured to provide signals indicative of detection of whether or not a given slot of a server cabinet is occupied. In some examples, sensors 501 are a set of sensors located at individual slots of a single server cabinet, for example sensor 122A-122J of server cabinet 101 as illustrated and described with respect to FIG. 3. In such examples, the combine statuses provided by each of sensors 501 could be used to determine an overall occupancy status for the server cabinet associated with the set of sensors represented by sensors 501. Examples of sensors 501 may correspond to a set of sensors located at a single server cabinet to detect the occupancy of slots all located on a single server cabinet, wherein in other examples the sensors 501 may provide occupancy statutes for slots locate on different server cabinets. As illustrated in FIG. 5, connection 502 may be a wired connection between each of sensors 501 and a set of input terminals 504 of input circuitry 520 including in monitoring circuitry 503. In other examples, one or more of sensors 501 may provide the sensor output signals indicative of the detection of whether or not a given slot of a server cabinet is occupied by a wireless communication transmitted to monitoring circuitry 503, as illustratively represented by lightning bolt 502A.

In various examples, monitoring circuitry 503 provides one or more visual displays configured to provide a visual representation of the statuses provided by sensors 501. In some examples, monitoring circuitry 503 includes a set of indicator lights 510 coupled to the input circuitry 520. In a simple implementation, each of the input terminals 504 of input circuitry 520 is electrically wired, as illustratively represented by output 506, to an individual one of the indicator lights provided as the set of indicator light 510. Each of indicator lights 510 may be configured to be illuminated when the signal provided by one of the sensors 501 associated with that indicator light provides a signal indicating that the slot being monitored by the sensor is not occupied. In various examples, indicator lights 510 comprise light-emitting diodes (LEDs) that may be driven and thus illuminated directly by the output signal being provided by the sensor 501 wired to that indicator light.

In various examples, input circuitry 520 comprises a logic circuitry 505 coupled to the input terminals 504, and configured to provide an output signal 507 based on a logical assessment of the status received from sensors 501 at input terminals 504. In some examples, logic circuitry 505 includes an "OR" gate logic function, wherein each of the statuses provided at input terminals 504 is provided as input to the "OR" gate function, and if any of the status provides a positive indication (e.g., a positive input to the logical "OR" gate), the logic circuitry 505 provides a positive output signal at output 507. The positive output signal is indicative of an overall status for the inputs provided by sensors 501 are indicative of at least one slot of the slots being monitored by sensors 501 being unoccupied. In examples where sensors 501 are all associated with slots of a same server cabinet, the overall status of output signal 507 is representative of the overall cabinet occupancy status with respect to whether all slots of the monitored cabinet are or are not occupied. For example, if logic circuitry 505 outputs a positive signal, that may be an indication that at least one of the slots of the server cabinet being monitored by sensors 501 is not occupied, and thus the overall cabinet occupancy status of the server cabin is "not fully occupied," and the output signal 507 may be provided to light 511 to illuminate light 511. On the other hand, if the output signal 507 is not a positive signal, that may be provided when the status of the sensor signals provided by sensors 501 each indicate that the slots being monitored by sensors 501 are all occupied. In these instances, the overall cabinet occupancy status of the server cabinet being monitored is "FULLY OCCUPIED," and light 511 will not be illuminated.

In various examples of monitoring circuitry 503, monitoring circuitry 503 comprises additional circuits including a communication circuitry 521, a power supply 524, and/or a display 512. In various examples, monitoring circuitry 503 also comprises a processor circuitry 522 and memory 523. Monitoring circuitry 503 may also comprise a data bus 530 configured to communicatively coupled one or more of the circuits included in monitoring circuitry 503. Power supply 524 may be coupled to an external power supply, such as commercially available electrical power source, and is configured to process the externally received power to generate a power source for powering the various circuits and or indicator lights included in monitoring circuitry 503. Communication circuitry 521 may be configured to receive wireless signals transmitted from sensors 501, and to provide these received signal as outputs signal to be transmitted via antenna 526 to one or more external devices (not shown in FIG. 5, but for example to cabinet monitoring circuitry 110 as illustrated and described with respect to FIG. 1). Communication circuitry 521 may also receive these output signal from the sensors 501 and provide these signals, or data derived from these signals, to processor circuitry 522 via data bus 530. Processor circuitry 522 may process these signals, and based on these signals, determine one or more occupancy statuses associated with the server cabinets being monitored by sensors 501.

Processor circuitry 522 may also be configured to generated one or more graphical displays based on and/or derived from the received sensor signals, and to control display 512 to display these one or more graphical displays to visually display information related to the occupancy statuses of the server cabinet or server cabinets being monitored by sensors 501. Processor circuitry 522 may also control the illumination of indicator lights 510 and/or indicator light 511 via data bus 530, for example to illuminate one or more of these lights based on the occupancy statuses based on and/or determined from the output sensor signals received from sensors 501. Data related to some or all of the signals received from the sensors 501 and/or generated by processor circuitry 522 may be stored into and retrieved from memory 523 by processor circuitry 522. Data related to some or all of the signals received from the sensors 501 and/or generated by processor circuitry 522 may be transmitted to one or more external devices (not shown in FIG. 5, but for example to cabinet monitoring circuitry 110 as illustrated and described with respect to FIG. 1) by communication circuitry 521 via antenna 526. Data related to some or all of the signals received from the sensors 501 and/or generated by processor circuitry 522 may be transmitted to one or more external devices (not shown in FIG. 5, but for example to cabinet monitoring circuitry 110 as illustrated and described with respect to FIG. 1) by communication circuitry 521 a port 525 coupled to the communication circuitry.

Figure 6:
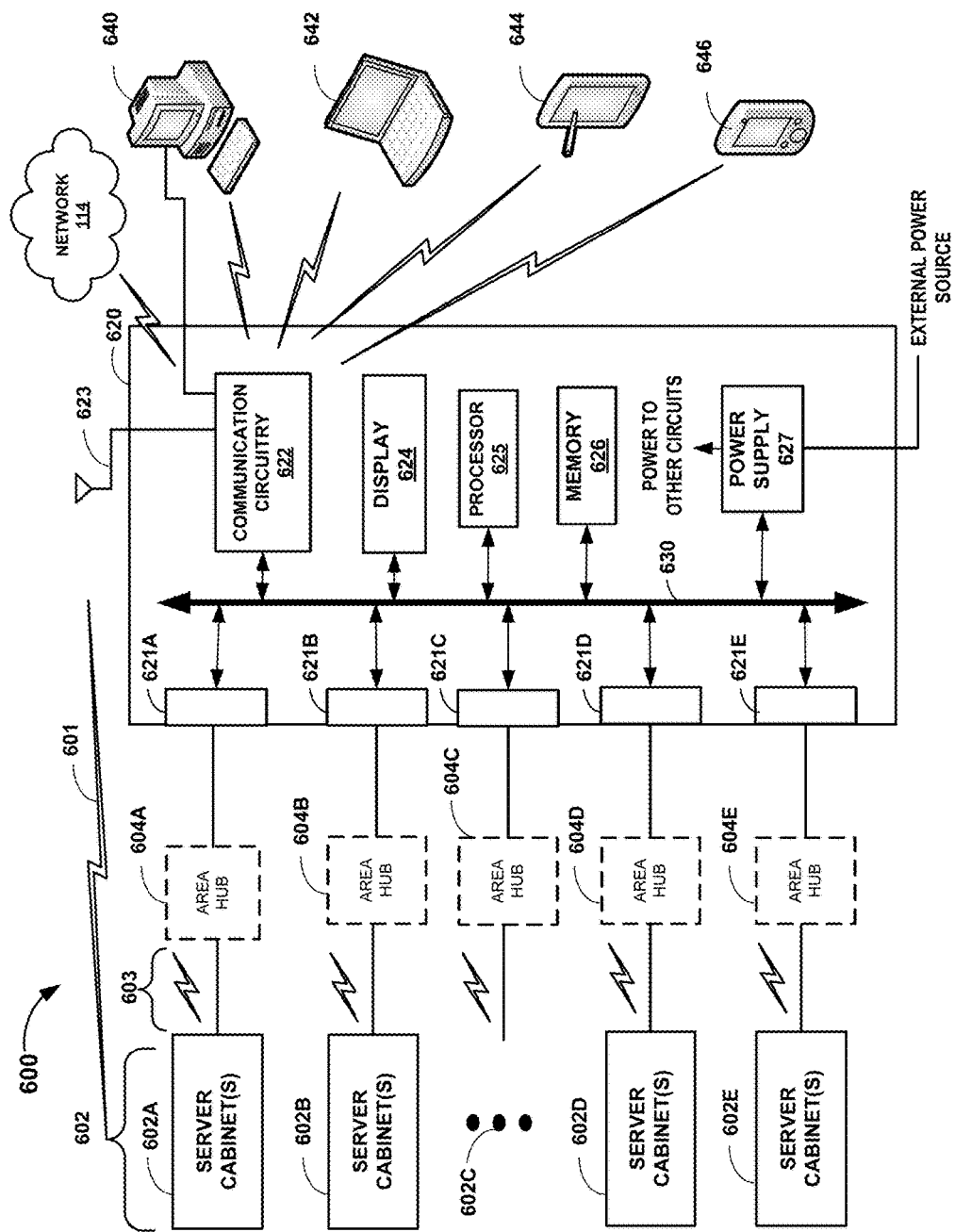
FIG. 6 illustrates a server cabinet monitoring system in accordance with one or more example techniques of this disclosure.

FIG. 6 illustrates a server cabinet monitoring system 600 in accordance with one or more example techniques of this disclosure. System 600 includes a plurality of server cabinets 602 communicatively coupled to a monitoring circuitry 620. Monitoring circuitry 620 may be configured to communicate with server cabinets 602 to monitor output signals transmitted by the server cabinets and/or sensor located at the server cabinets, and to process the output signals and to provide outputs related to the occupancy statuses of the slots and with respect to the overall occupancy statuses of the server cabinets being monitored.

As illustrated in FIG. 6, system 600 includes sets of server cabinet(s) 602A, 602B, 602D, and 602E. Each of these sets of server cabinet(s) 602A, 602B, 602D, and 602E are not limited to a particular number of server cabinets, and in some examples, may represent a single server cabinet per set, the single server cabinet including a set of sensors configured to detect whether each slot in the server cabinet is or is not occupied by an electronic device or a blanking cover. In other examples, one or more of the sets of server cabinets 602A, 602B, 602D, and 602E may include two or more server cabinets. For example, a given set of the server cabinets 602A, 602B, 602D, and 602E may represent a plurality of server cabinets, and in some examples all server cabinets located in a particular zone of a data center. The total number of sets of server cabinets that may be included and monitored by monitoring circuitry 620 is not limited to any particular number of server cabinets, and additional server cabinet(s) are illustratively represented by dots 602C, which may include one or more additional server cabinets as described above for server cabinets 602A, 602B, 602D, and 602E.

As described above, each of server cabinets 602 are communicatively coupled to monitoring circuitry 620 to provide output signals to monitoring circuitry 620 related to the occupancy status of each of the server cabinets. In some examples, the sensors located on one or more of the server cabinets 602 may wirelessly transmit, from each sensor, a sensor output signal, collectively illustratively by lightning bolt 601, to monitoring circuitry 620. In other examples, a monitoring circuitry located at a server cabinet (such as cabinet monitoring circuitry 130 and 150 illustrated and described with respect to FIG. 3), may receive the sensor output signals from the sensors located on a server cabinet, and generate the cabinet output signals for that server cabinet, which may then be wirelessly transmitted to the monitoring circuitry 620. These wireless transmissions directly between sensors and/or cabinets to monitoring circuitry 620 may be used in system 600 for example when the total number of server cabinets is smaller, for example a hundred or less server cabinets, and/or when the distances between the server cabinets and monitoring circuitry 620 is small, for example not more than several feet, that allows for use of short-range wireless signal transmissions, such as a Bluetooth wireless transmission.

In some examples, one or more sets of the server cabinets 602 may be directly wired, for example using a wired connection or a data bus, to a port of monitoring circuitry 620. As shown in FIG. 6, server cabinets 602A may be communicative coupled to port 621A on monitoring circuitry 620. In some examples, server cabinet(s) may be directly wired, for example by a data bus 603, to port 621A. In other examples, server cabinet 602A is communicatively coupled first to an area hub 604, wherein area hub 604 is then communicatively coupled to port 621. Server cabinet 602A may be coupled to area hub 604A either by a wired connection, such as a data bus, or by a wireless connection, as illustrated in FIG. 3. Area hub 604A is not necessarily limited to be communicatively coupled to server cabinet(s) 602A, and may be used to communicatively coupled to any number of server cabinets, and provide communicative coupling of these server cabinets to port 621A of monitoring circuitry 620. In a similar manner, server cabinet(s) 602B may be directly wired to port 621B of monitoring circuitry 620 for example by a data bus 603, or may be communicatively coupled to port 621B through area hub 604B. Server cabinet(s) 602B may be communicatively coupled to area hub 604B either wirelessly or by a wired connection. Server cabinet(s) 602D may be directly wired to port 621D of monitoring circuitry 620 for example by a data bus 603, or may be communicatively coupled to port 621D through area hub 604D. Server cabinet(s) 602D may be communicatively coupled to area hub 604D either wirelessly or by a wired connection. Server cabinet(s) 602E may be directly wired to port 621E of monitoring circuitry 620 for example by a data bus 603, or may be communicatively coupled to port 621E through area hub 604E. Server cabinet(s) 602E may be communicatively coupled to area hub 604E either wirelessly or by a wired connection. If additional server cabinet(s) 602C are present in system 600, the additional server cabinet(s) 602C may be directly wired to port 621C of monitoring circuitry 620 for example by a data bus 603, or may be communicatively coupled to port 621C through area hub 604C. Additional server cabinet(s) 602C may be communicatively coupled to area hub 604C either wirelessly or by a wired connection.

In various examples, monitoring circuitry 620 includes communication circuitry 622 coupled to antenna 623, a display 624, processor circuitry 625, memory 626, and power supply 627. In various examples, monitoring circuitry 620 includes a data bus 630 configured to communicatively couple the circuitry and devices included in monitoring circuitry 620. In various examples as described above, monitoring circuitry 620 includes ports 621A-621E. In examples of monitoring circuitry 620 that includes ports, such as ports 621A-621E, these ports may be communicatively coupled to data bus 630. In examples where monitoring circuitry receives all of the communications wirelessly from the sets of server cabinet(s) 602, monitoring circuitry may not include ports such as ports 621A-621E configured to communicate with the sets of server cabinets.

Power supply 627 may be coupled to an external power source, such and as a source of commercially provided electrical power provided by an electrical utility company, or some other power source, such as an external power supply. Power supply 627 may be configured to receive electrical power from the external power source, and in some examples, performs various processes such as rectification, voltage conversion, and/or filtering on the power received from the external power source, and to provide one or more power outputs that may be used to power the additional circuitry included in monitoring circuitry 620.

Communication circuitry 622 is coupled to an antenna 623, and is configured to receive wireless communications from the sets of server cabinets 602, as illustratively represented by lightning bolt 601. Communication circuitry 622 may also be coupled to ports 621A-621E through data bus 630, and may be configured to be communicative coupled to one or more of the set of server cabinets 602 thought these ports. Communication circuitry 622 may be configured to receive any of the output signals, e.g., sensor output signals and/or cabinet output signals as described above. Communication circuitry 622 may provide these output signals, and/or data extracted from these signals generated by processing performed on the output signals by communication circuitry 622, to data bus 630. In some examples, communication circuitry 622 is configured receive the sensor output signals and/or the cabinet output signals, and to generate one or more monitoring circuitry output signals that may be provided to various external devices such as computer 640, laptop computer 642, electronic personal digital assistant 644, and/or mobile device 646.

In various examples, communication circuitry 622 is also configured to transmit communication signals to one or more of the sets of server cabinets 602. For example, one or more of the server cabinets 602 may be configured to only transmit output signals, such sensor output signals and/or cabinet output signals, when polled for these transmissions. In these examples, communication circuitry 622 may be configured to issue a polling request to a server cabinet, requesting that the polled server cabinet provide an output signal or signals including information related to the occupancy status of that cabinet. In such instances, the polling output signals provided by the communication circuitry 622 may be used to control the timing of output signals transmitted back to the communication circuitry 622 and monitoring circuitry 620. In some examples, the communication of the output signals from the sets of server cabinets 602 may be based on an ad hoc scheme, and/or some other form of a bus arbitration scheme, and communication circuitry 622 is then configured to receive and process these incoming signals provided by the sets of server cabinets 602 based on the ad hoc and/or the bus arbitration protocol.

Monitoring circuitry 620 may be configured to received output signals, either wirelessly via antenna 623, or by wired connections through one or more of ports 621A-621E, and/or both wirelessly and through one or more of ports 621A-621E. These output signals may be signals generated and transmitted directly from sensors located on one or more of the server cabinets, or from cabinet monitoring circuits located at one or more of the server cabinets, and/or from one or more of the areas hubs 604A-604B. In some examples, processor circuitry 625 is configured to receive these output signals, and to process these output signals to determine one or more current occupancy statuses associated with the received output signals.

In some examples, processor circuitry 625 is configured to receive a set of output signals from the sensors located on a particular server cabinet, the output signals indicative of the occupancy status detected for each of the slots of the particular server cabinet. Based on these output signals, processor circuitry 625 may determine an overall occupancy status for the particular cabinet. For example, if the output signals indicate that all slots of the particular server cabinet are occupied, processor circuitry 625 may generate an overall occupancy status indication of "FULLY OCCUPIED" as the current status for the particular cabinet. If the output signals indicate that only one of the slots of the particular server cabinet is not occupied, processor circuitry 625 may generate an overall occupancy status indication of "ONE SLOT OPEN" as the current status for the particular server cabinet. If the output signals indicate that only more than one of the slots of the particular server cabinet are not occupied, processor circuitry 625 may generate and overall occupancy status indication of "MULTIPLE SLOTS OPEN" as the current status for the particular server cabinet. In examples where the server cabinet is polled for output signals and no response is received, processor circuitry 625 may generate and overall status indication of "NOT RESPONDING" as the current status for the particular server cabinet.

The information provided by the output signals, along with the generated overall output statuses, may be stored in memory 626, and later retrieved by processor circuitry 625 to generated one or more graphical displays indicative of the statuses associated with the particular cabinet. These generated graphical displays, under the control of processing circuitry 625 may be be displayed in various formats on display 624. Processor circuitry 625 may be configured to process output signals and to determine overall occupancy status or at least current status for each of the sets of server cabinets 602 within system 600. All or portion of this information may be stored in memory 626. Processor circuitry 625 may be configured to retrieve information stored in memory 626, and use this information to generate one or more graphical displays that provide a visual representation of information related to one or more of the statuses determined for the server cabinets of system 600.

These generated graphical displays may be displayed, for example using control provide by processor circuitry 625 on display 624. Inputs to control and manipulate the graphical display provided on display 624 may be input to monitoring circuitry by an external device, such as computer 640. In other examples, display 624 is a touchscreen device, and manipulation, for example provided by a finger of a human operator or by a stylus, and provided to touchscreen may be used to manipulate and control the graphical displays being provide at display 624. In various examples, processor circuitry 625 is configured to communication, for example through communication circuitry 622, with one or more of external devices 640, 642, 644, and/or 646 to enable these external devices to display the graphical display on the display devices included with these devices.

In various examples, communication circuitry 622 is configured to wirelessly communication with network 114, and may communicate to network 114 any of the information received as signals from server cabinets 602, and any of the information, including graphical displays, that may be generated by processor circuitry 625. As described above with respect to FIG. 1, network 114 may be coupled to database and one or more other external devices that allow user, such as customers or persons associated with the operation of a data center or centers where server cabinets are located to access and view information related to system 600 and the occupancy statuses associated with one or more of the sets of server cabinet 602 being monitored by system 600.

The types of communications provided within and to and from system 600 are not limited to any particular types of wired or wireless communication hardware, bus structures, or protocols. Different portions of system 600 may utilize different types of communication hardware, different types of bus structures, and/or different types of communication protocols. In some examples, one or more portions of system 600 may incorporate a proprietary type of communication hardware, proprietary bus structure(s), and/or proprietary communication protocol(s). In some examples, portion of system 600 may utilizes one or more aspects of a data center infrastructure monitoring (DCIM) edge system, which is described in U.S. Provisional Patent Application Ser. No. 62/336,300, filed May 13, 2016, and is also described in U.S. Provisional Patent Application Ser. No. 62/353,471 filed Jun. 22, 2016, both application being hereby incorporated by reference in this disclosure in their entireties.

Figure 7:
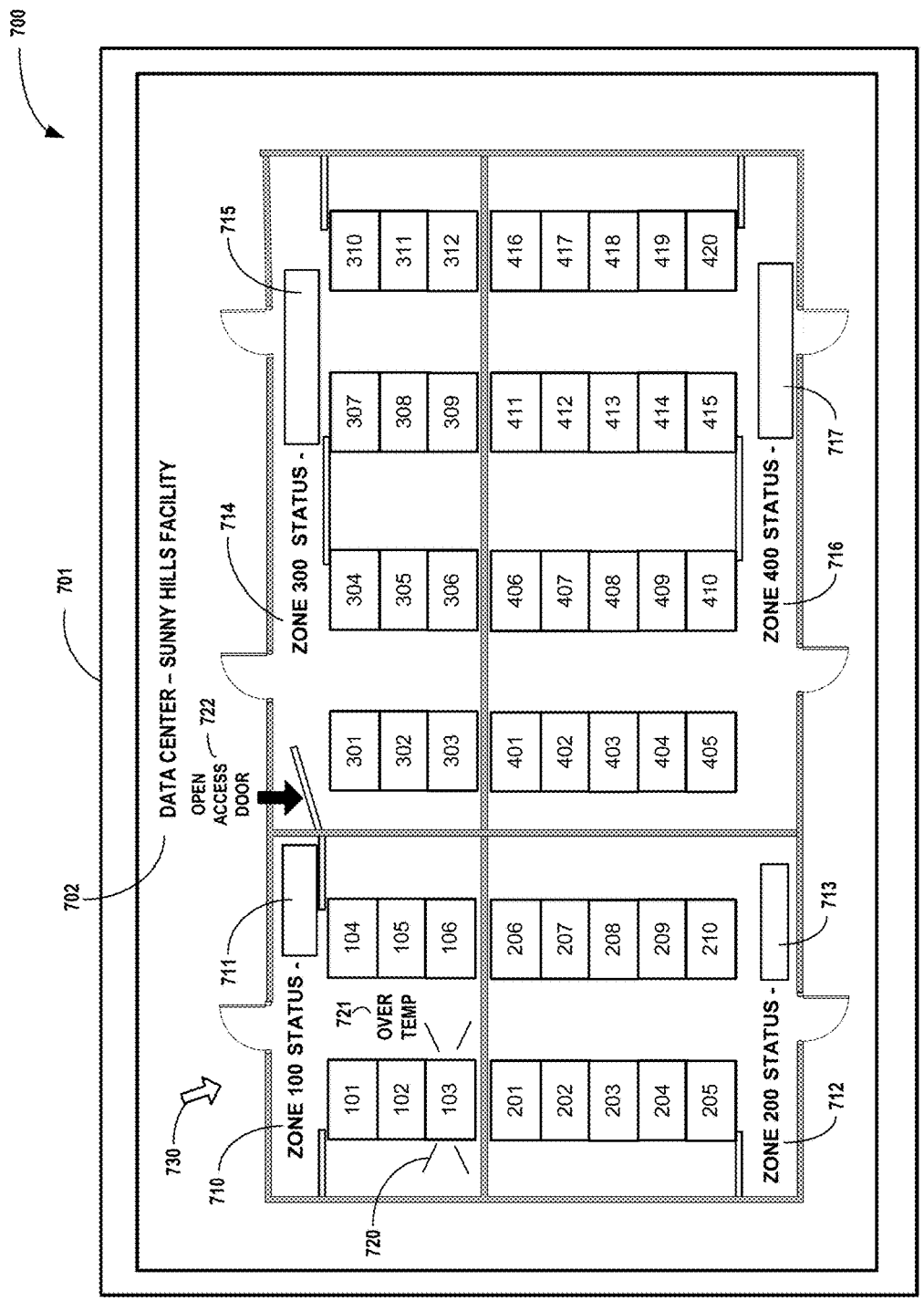
FIG. 7 illustrates an example graphical display generated and displayed in accordance with one or more example techniques of this disclosure.

FIG. 7 illustrates a graphical display 700 generated and displayed in accordance with one or more example techniques of this disclosure. As illustrated in FIG. 7, a graphical display device 701 is configured to provide a graphical display 700 representing a visual representation of at least some portion or portions of a data center storage space. In some examples, graphical display device 701 is display 111 of monitoring circuitry 110 as illustrated and described with respect to FIG. 1. In some examples, graphical display device 701 is display 131 of cabinet monitoring circuitry 130 and/or is display device 151 of monitoring circuitry 150 as illustrated and describe with respect to FIG. 3. In some examples, graphical display device 701 is display 512 of monitoring circuitry 503 as illustrated and describe with respect to FIG. 5. In some examples, graphical display device 701 is the display 624 of monitoring circuitry 660, and/or any of the display devices provide by devices 640, 642, 644, and 646, as illustrated and described with respect to FIG. 6.

Referring to FIG. 7, graphical display 700 includes a plan view of a data center, such as data center 10 as illustrated and described above with respect to FIG. 1, including visual representations of zones 100, 200, 300, and 400, and illustrating blocks 101-106, 201-210, 301-312, and 401-420 illustrative of the server cabinets in each of zones 100, 200, 300, and 400. The positioning and layout in graphical display 700 is illustrative of the positioning and relative locations of server cabinets within each of these zones. In various examples, graphical display includes a display of a text header 702. Text header 702 is not limited to any a display of any particular type of text or information. By way of example, text header 702 as illustrated in FIG. 7 indicates what is being displayed by graphical display 700, e.g., the "DATA CENTER—SUNNY HILLS FACILITY" Text header 702 may include other types of graphical images, including symbols, trademarks, and text representing any type of information that may be relevant to graphical display 700, including for example date and time information.

As shown in FIG. 7, each of the zones depicted for the data center in graphical display 700 includes a zone identification text header and a zone status field. The graphical depiction of zone 100 includes a zone 100 text header 710 identifying the zone as "ZONE 100," followed by the word "STATUS" and a zone 100 status field 711. The zone 100 status field 711 may be filled in with a word, a phrase or a string of text that indicates status information associated with zone 100. For example, information related to the current occupancy statuses of the server cabinets 101-106 located in zone 100 may be provided in the zone 100 status field 711. Phrase such as "ALL CABINET SLOTS FULLY OCCUPIED" may be provided as a message status field 711. In another example, status information for specific server cabinet may be provided in message status field 711, such as "CABINET 103 HAS AN OPEN SLOT" or in another example, "CABINET 101 IS NOT RESPONDING" The messages and or other graphical representations that may be provided in status field 711 are not limited to any particular type of graphical representation and/or text, and may be provided to shown any information that may be relevant to the status of zone 100.

Other forms of visual indications may be provided as part of graphical display 700 that may be useful to provide information about the status of zone 100 or other zones depicted in graphical display 700. For example, different colors can be used within graphical display 700 to provide information about status or statuses related to the depicted zones. By way of example, the floor space enclosed within zone 100 as depicted in graphical display 700 may be rendered in a first color, for example in green, if all cabinets in zone 100 are fully occupied, and may be rendered in a second color, for example in red, if at least one of the server cabinets in zone 100 is detected to have one or more unoccupied slots. Ion another example, a block representing a server cabinet detected as having at least one unoccupied slot may be illustrated as a flashing block, blinking on and off, as illustratively represented by lines 720 extending from the block representative of server cabinet 103 in zone 100.

In a similar manner as described above for zone 100, the depictions in graphical display 700 of each of zones 200, 300, and 400 includes an identification text header and a zone status field. In the graphical display 700 as shown in FIG. 7, the graphical depiction of zone 200 includes identification text header 712 and a zone status field 713, the graphical depiction of zone 300 includes identification text header 714 and a zone status field 715, and the graphical depiction of zone 400 includes identification text header 716 and a zone status field 717. The identification text headers and a zone status fields associated with zones 200, 300, and 400 may be configured to provide and to perform any of the graphical display function as described above for these corresponding features of zone 100, but for the corresponding one of zones 200, 300, or 400 respectively.

In addition to providing information related to that occupancy statuses of the server cabinets depicted in graphical display 700, other information may be included in graphical display 700 that is not necessarily related to these occupancy statuses. For example, text messages related to the statuses of the data center depicted in graphical display 700 may be included as part of the displayed information. By way of example, an "OVER-TEMP" text message 721 is displayed in the cold aisle in the depiction of zone 100, which provides an indication that there may be a temperature related issue detected for that portion of the data center. In another example, a text message 722 of "OPEN ACCESS DOOR" and an associated arrow are provided as part of graphical display 700 that may be provided to alert a user that an access door to a hot aisle in zone 200 is open.

These examples of the depictions of various aspects of a data center are intended to be illustrative and non-limiting examples. Other formats, means, and techniques for displaying information related to the various statuses of a data center, including statuses relate to the occupancy status of the server cabinets located within the data center, are possible and are contemplated for use in the graphical display of information related to a data center as part of this disclosure.

In addition to the various graphical depictions described above with respect to graphical display 700, graphical display 700 may also include a depiction of a moveable cursor, such as movable cursor 730. Control functions associated with movable cursor 730, such as moving and re-orientation of the movable cursor 730 with in and around to different locations of graphical display 700, and an indication of a selection of an item or area within graphical display 700 may be made in a number of different ways. For example, display device 701 may comprise a touch screen that allow inputs to the touchscreen that control movement and selections made using movable cursor 730. In other examples, input to manipulate moveable cursor may be provided by a device (not shown in FIG. 7), such as a computer, the is communicatively coupled to display device 701.

In some examples, using movable cursor 730 allows for various portions of graphical display 700 to be selected, for example by placing movable cursor 730 so that movable cursor 730 points to or is positioned over the desired portion of plan view of the data center, and actuating an input, such as clicking a switch on a computer mouse, to indicate selection of the area indicated by the moveable cursor. By way of example, if the moveable cursor 730 is placed over an area included within zone 100 but not over any one of the blocks depicting server cabinets, and the selection indication is provided, graphical display 700 may be refreshed to illustrate an enlarged view of only zone 100, for example as illustrated in FIG. 8.

Figure 8:
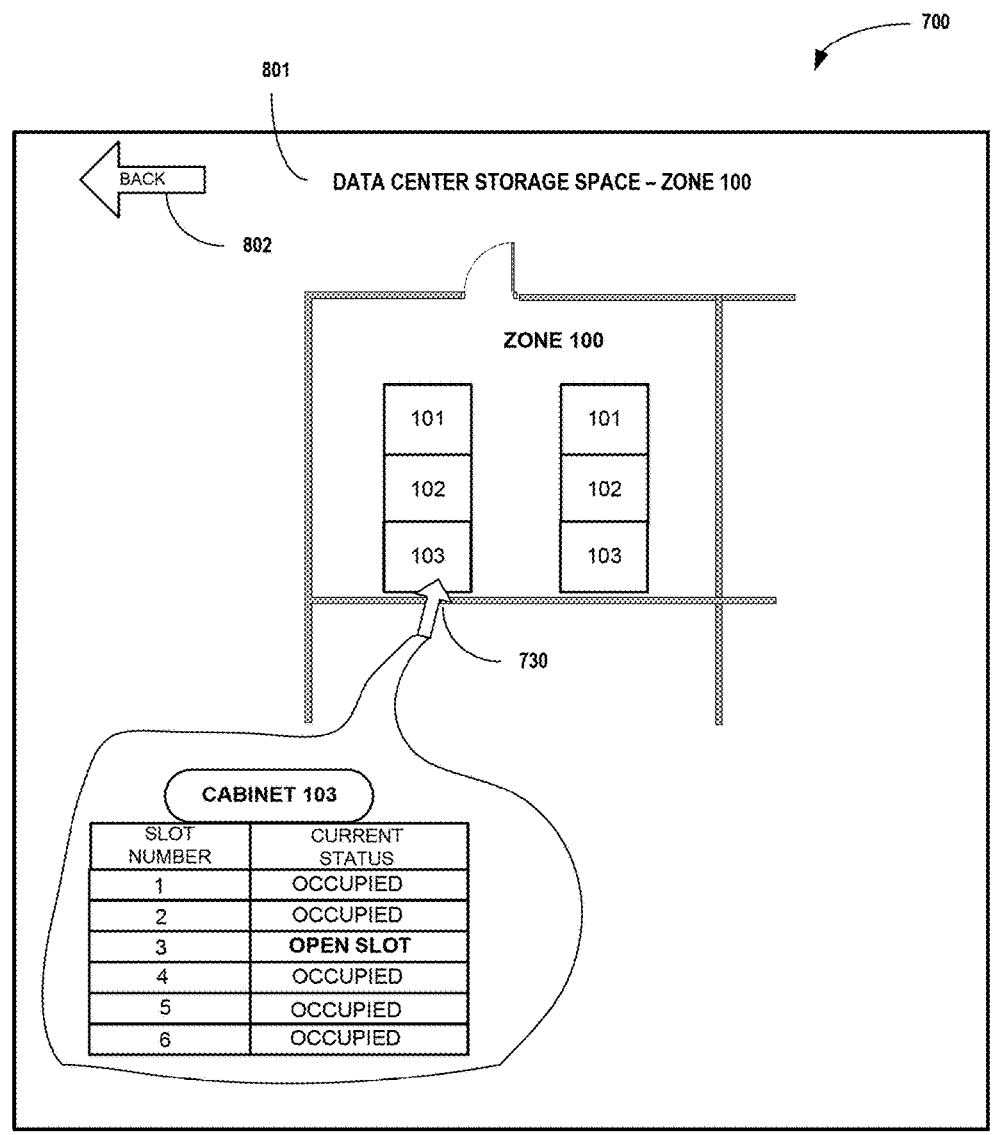
FIG. 8 illustrates another example of a graphical display generated and displayed in accordance with one or more example techniques of this disclosure.

As further illustrated in FIG. 8, graphical display 700 has be revised to display only the portion of the data center that includes zone 100. A text header 801 displayed at the top of the revised version of graphical display 700 shown text of "DATA STORAGE SPACE—ZONE 100," indicating that the graphical display 700 now displays a depiction of zone 100. The "BACK" arrow 802 is provide with graphical display 700, and if selected, may be configured to revise graphical display to return to the depiction previously provided as graphical display 700 prior to being revises as shown in FIG. 8. In various examples, if the moveable cursor 730 is placed over the one of the block in FIG. 8 that depicts a server cabinet in zone 100, a tabular list associated with the occupancy status of the slots of server cabinet 103 will be displayed as part of graphical display 700. As similar tabular listing for any of the blocks depicting server cabinets in zone 100 as display in graphical display 700 may be provided as part of the graphical display 700 by selection of the block associated with the any of the server cabinets depicted in FIG. 8 in a manner similar to that described above with respect to server cabinet 103.

FIG. 9 illustrates another example of graphical display 700 that may be provided for display on a graphical display device according to various techniques of this disclosure. As shown in FIG. 9, a set of tabular listing of the statuses of each of the server cabinets is displayed for each of zones 100, 200, 300, and 400. By way of illustrative example, a tabular listing 901 is displayed that includes a header indicating that the tabular listing 902 is associated with "ZONE 100," followed by a listing including a left-hand column of row with server cabinet numbers for the server cabinets included within zone 100 displayed and a corresponding right-hand column of row with a status indicating displayed for each of the server cabinets of zone 100. A similar tabular listing 902 is displayed as part of graphical display 700 for the server cabinets of zone 200, and as tabular listing 903 for the server cabinets of zone 300, and as tabular listing 904 for the server cabinets of zone 400.

Figure 10:
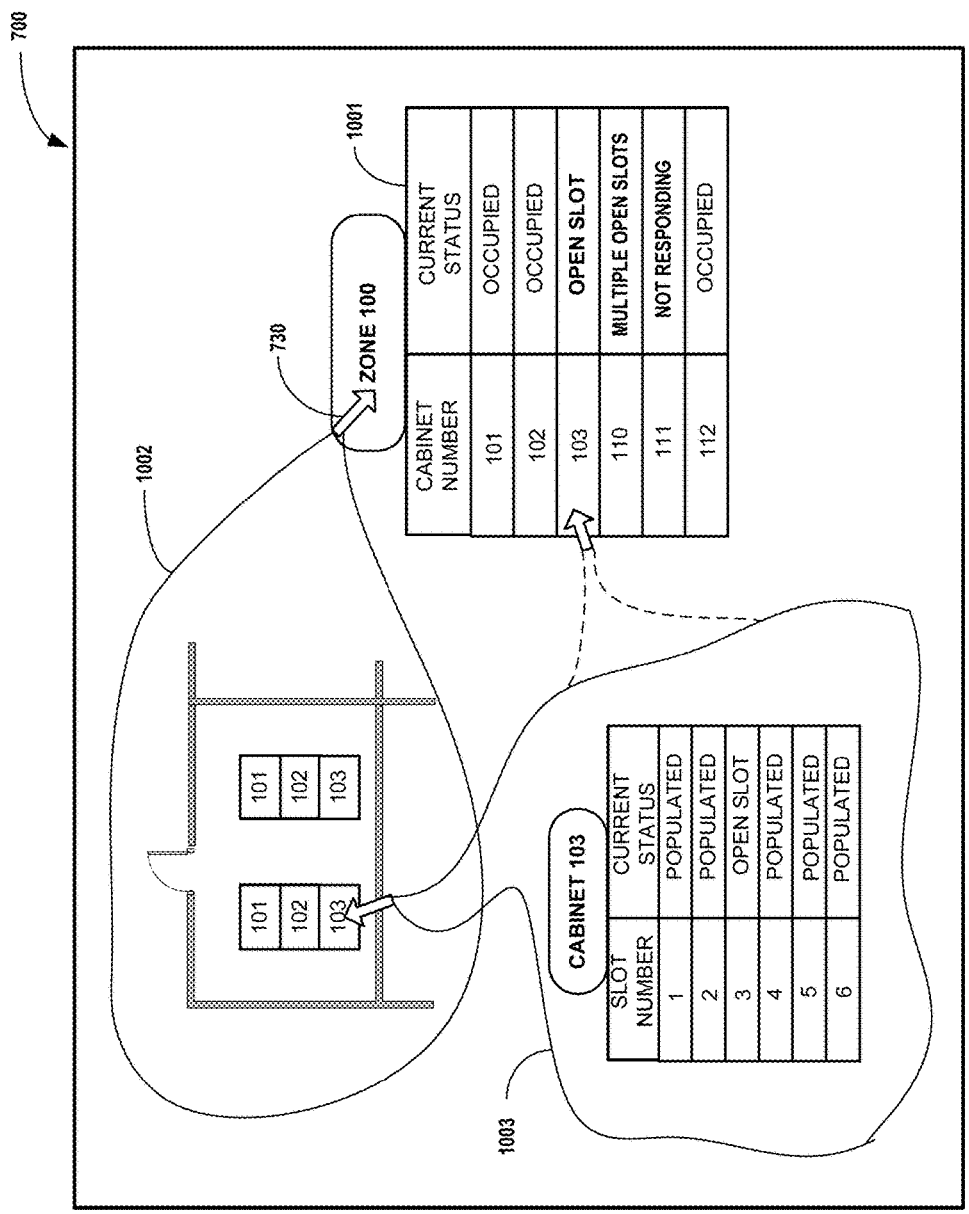
FIG. 10 illustrates another example of a graphical display generated and displayed in accordance with one or more example techniques of this disclosure.

FIG. 10 illustrates another example of graphical display 700 that may be provided for display on a graphical display device according to various techniques of this disclosure. The version of graphical display 700 as shown in FIG. 10 includes a tabular listing 1001 of the server cabinets include in zone 100, and a cabinet occupancy status determined for each of these server cabinets. By moving cursor 730 over the header of tabular listing 1001 and selecting the header, a plan layout diagram 1002 may appear as part of the graphical display as shown in FIG. 10. Once the plan layout diagram 1002 is displayed, a given one of the server cabinets, for example server cabinet 103 is depicted in plan layout diagram 1002, may be selected using the cursor, and a tabular listing 1003 of the slot status for the slots of the selected server cabinet may be provide as part of graphical display 700. In the alternative, tabular listing 1003 may be generated and displayed as part of graphical display 700 by selected a server cabinet number, for example server cabinet number 103, directly for the originally provided tabular listing 1001.

Figure 11:
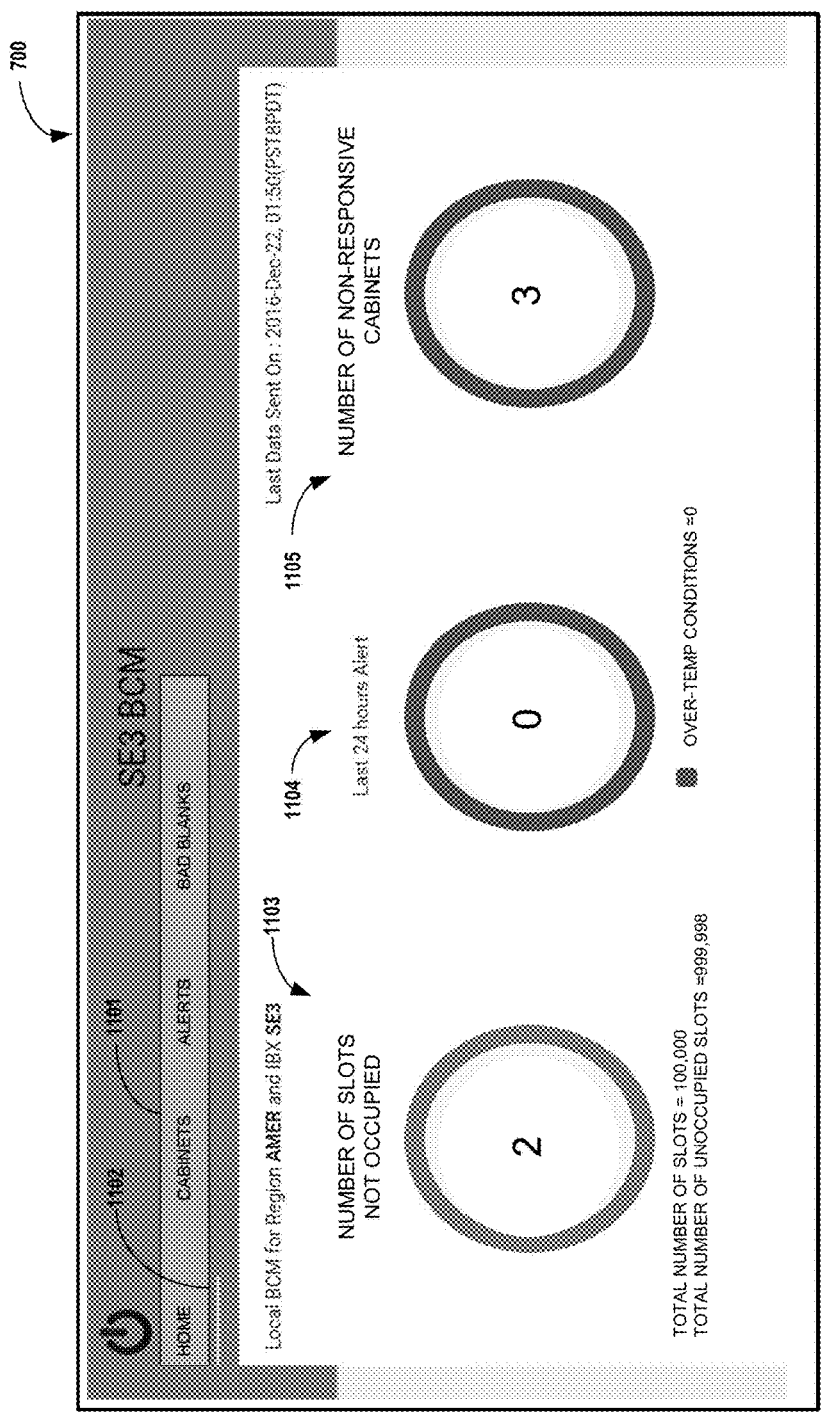
FIG. 11 illustrates another example of a graphical display generated and displayed in accordance with one or more example techniques of this disclosure.

FIG. 11 illustrates another example of a graphical display 700 generated and displayed in accordance with one or more example techniques of this disclosure. The version of graphical display 700 as shown in FIG. 11 includes a front page view of a graphical user interface (GUI) that may be displayed for example on display device 701. The GUI as shown in FIG. 11 includes menu selection bar 1101, and a selection cursor 1102 that is positioned under the "HOME" menu item. Selection cursor 1102 may be moved to be positioned under other items of the menu selection bar 1101, and once in one of these other positions, access to other GUIs may be provide based on positioning alone, or positioning and selection of another menu item displayed on selection bar 1101, using selection cursor 1102.

As illustrated in FIG. 11, the "HOME" GUI may include various text fields providing information generated by an occupancy monitoring system operating in a data center. For example, the GUI may display text indicating a location and/or region identifying a data center being monitored and generating the information that is being displayed. In addition, one or more indicators 1103, 1104, and 1105 may be displayed as part of the GUI. Indicator 1103 includes a display of a header "NUMBER OF SLOTS NOT OCCUPIED," and a graphical item (e.g., a circle enclosing a number) that may provide current information related to the number of slots in the identified data center that are not currently occupied, and other statistical data. Indicator 1104 includes a display of a header "Last 24 hours Alert" and a graphical item (e.g., a circle enclosing a number) that may provide current information related to alerts, such as over-temperature conditions, that may have occurred over a previously defined time period, and other information related to alerts. Indicator 1105 includes a display of a header "NUMBER OF NON-RESPONSIVE CABINETS" and a graphical item (e.g., a circle enclosing a number) that may provide current information related to cabinets in the identified data center that are not providing and/or are not responding to requests for information related to one or more statuses being monitored with respect to these cabinets. In various examples, the indicators and the numbers provided by these indicators is dynamically updated in real time, and thus provide another tool for monitoring the overall statuses, including occupancy statuses, for a data center.

Figure 12:
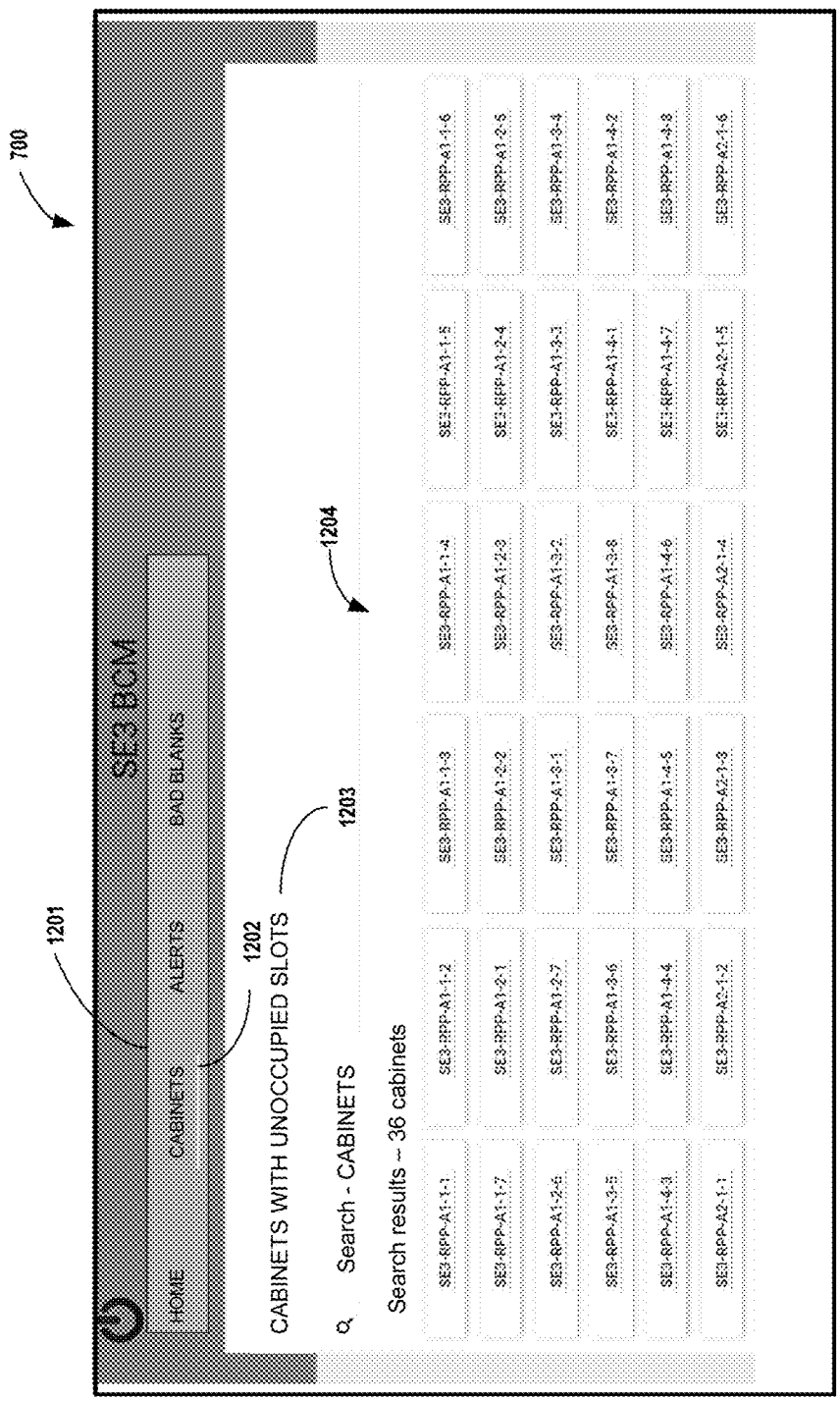
FIG. 12 illustrates another example of a graphical display generated and displayed in accordance with one or more example techniques of this disclosure.

FIG. 12 illustrates another example of a graphical display 700 generated and displayed in accordance with one or more example techniques of this disclosure. The version of graphical display 700 as shown in FIG. 12 includes a view of a graphical user interface (GUI) that may be displayed, for example on display device 701. The GUI as shown in FIG. 12 includes menu selection bar 1201, and a selection cursor 1201 that is positioned under the "CABINETS" menu item. Selection cursor 1202 may be moved to be positioned under other items of the menu selection bar 1201, and once in one of these other positions, access to other GUIs may be provide based on positioning alone, or positioning and selection of another menu item displayed on selection bar 1201 using selection cursor 1202.

As illustrated in FIG. 12, a search function is provided. Based on a request for a search of "CABINETS WITH UNOCCUPIED SLOTS." in this illustrative example, the results of the search request are provided as a listing 1204 comprising thirty-six search results. The listing includes an identification of the cabinets identified for examples by a monitoring system such as monitoring system 600, as having unoccupied slots.

Figure 13:
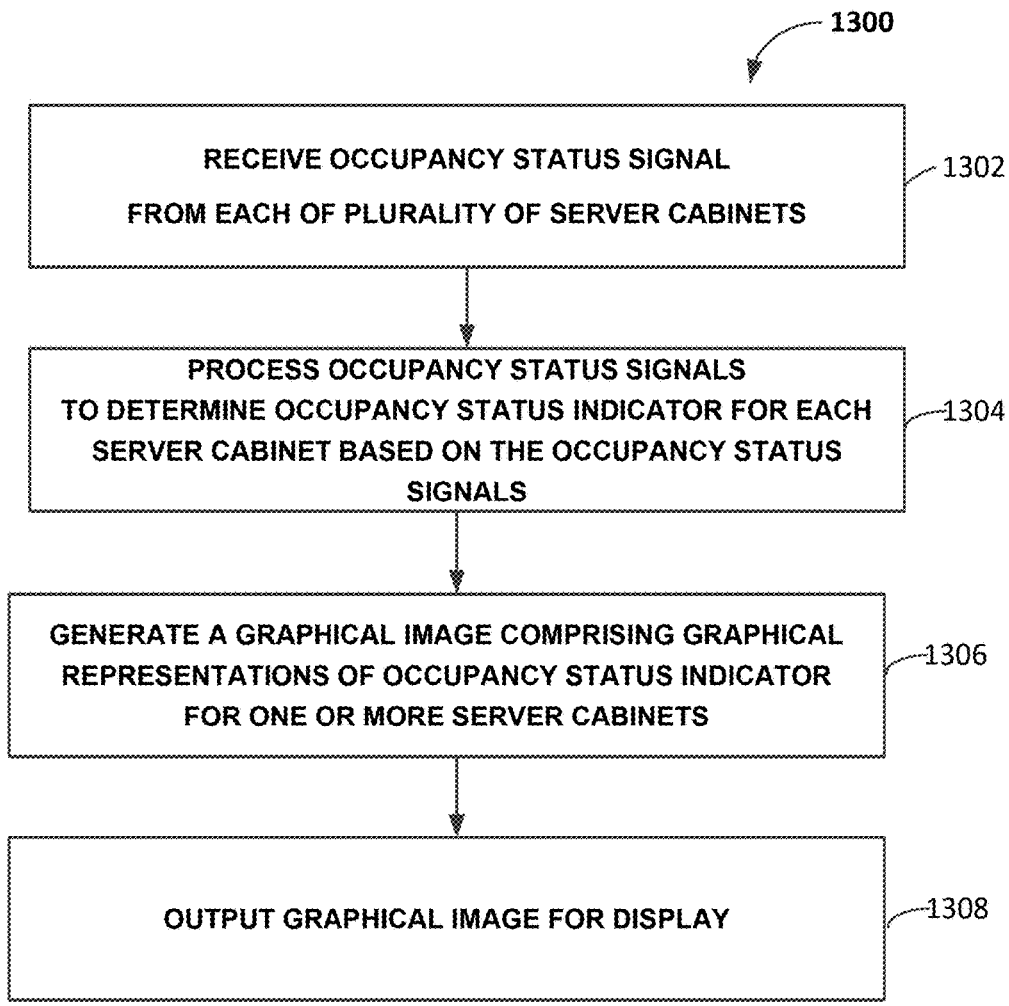
FIG. 13 illustrates flow diagram of a method in accordance with one or more example techniques of the disclosure.

FIG. 13 illustrates a flow diagram of a method 1300 in accordance with one or more example techniques of the disclosure. Although method 1300 is described as being performed by monitoring circuitry 620, the method is not limited to being performed by monitoring circuitry 620, and may be performed in whole or in part by monitoring circuitry 110 illustrated and described with respect to FIG. 1, and may be performed in whole or in part by monitoring circuitry 130 and/or monitoring circuitry 150 as illustrated and described with respect to FIG. 3. In various examples according to method 1300, communication circuitry 622 of monitoring circuitry receives an occupancy status signal from each of a plurality of server cabinets located in a data center storage space, the occupancy status signal comprising information indicative of an occupancy status for each of the server cabinets (block 1302). Processor circuitry 625 processes the occupancy status signal received from each of the server cabinets to determine an occupancy status indication for each of the server cabinets based on the information provided in the occupancy status signal associated with each server cabinet (block 1304). Processor circuitry 625 generates a graphical image comprising a graphical representation of the occupancy status indications for one or more of the server cabinets included in the data center storage space (block 1306). Processor circuitry 625 and/or communication circuitry 622 outputs the graphical image for display (block 1308).

Figure 14:
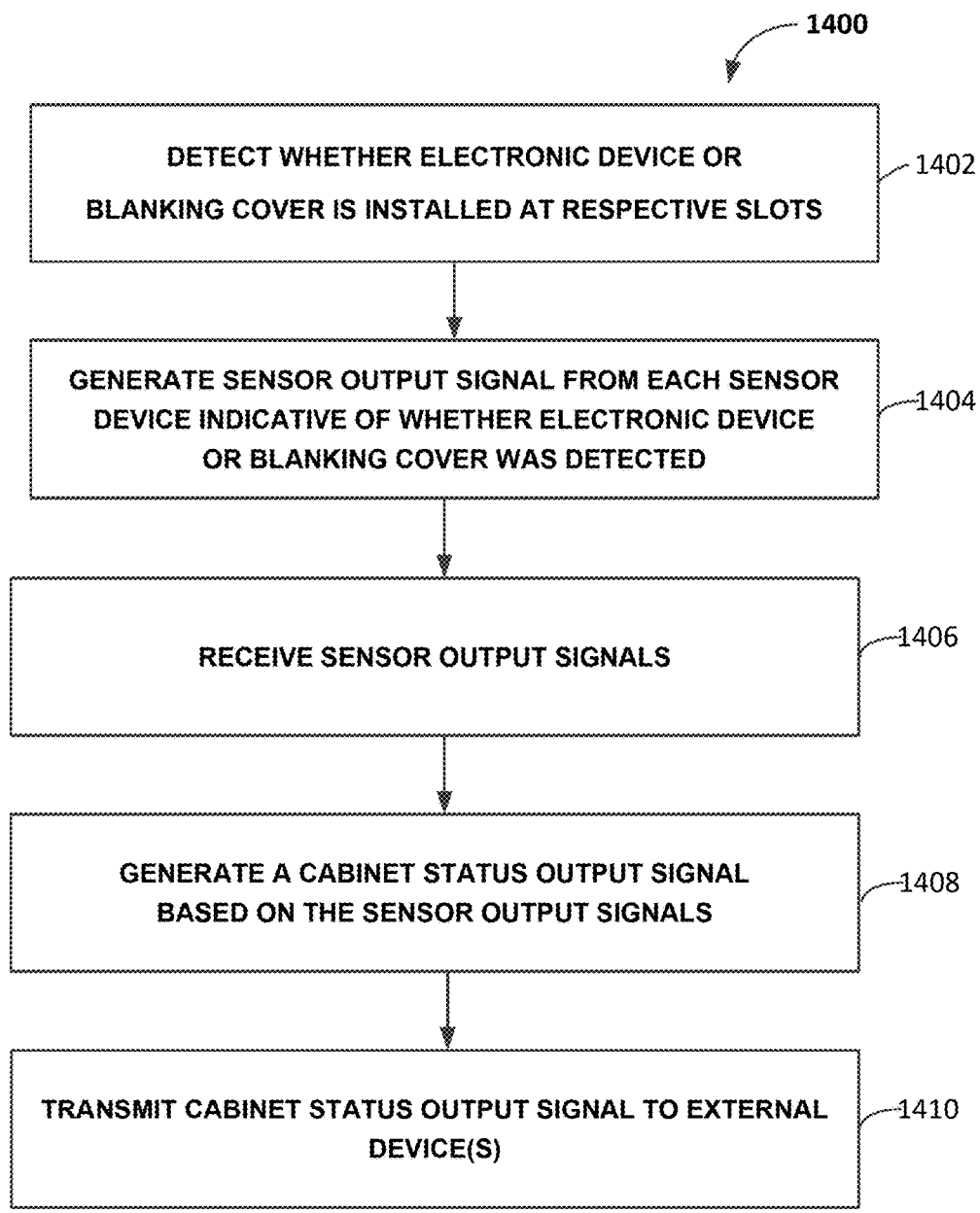
FIG. 14 illustrates flow diagram of a method in accordance with one or more example techniques of the disclosure.

FIG. 14 illustrates a flow diagram of a method 1400 in accordance with one or more example techniques of the disclosure. Although method 1400 is described as being performed by monitoring circuitry 503, the method is not limited to being performed by monitoring circuitry 130, and may be performed in whole or in part by monitoring circuitry 110 illustrated and described with respect to FIG. 1, and may be performed in whole or in part by monitoring circuitry 150 as illustrated and described with respect to FIG. 3, and may be performed in whole or in part by monitoring circuitry 620 as illustrated and described with respect to FIG. 6.

In various examples according to method 1400, sensors 122A-122J detect whether an electronic device or a blanking cover is installed at the respective slots from each of the individual sensor devices (block 1402). Sensors 122A-122J generate a sensor output signal, the sensor output signal indicative of whether an electronic device or a blanking cover was detected by the individual sensor device (block 1404). Input circuitry 520 of monitoring circuitry 503 receive each of the sensor output signals (block 1406). Processor circuitry 522 of monitoring circuitry 503 generates a cabinet status output signal based on the received sensor output signals, the cabinet status output signal comprising at least an indication of whether any of the sensor output signals indicated that a slot of the server cabinet was not occupied by and electronic device or by a blanking cover installed at the slot (block 1408). Communication circuitry 521 of monitoring circuitry 503 transmits the cabinet status output signal to one or more external devices (block 1410).

The techniques of this disclosure may be implemented in a wide variety of computing devices, medical devices, or any combination thereof. Any of the described units, modules or components may be implemented together or separately as discrete but interoperable logic devices. Depiction of different features as modules, units, circuits, or circuitry, is intended to highlight different functional aspects and does not necessarily imply that such modules, units, circuits, or circuitry must be realized by separate hardware or software components. Rather, functionality associated with one or more modules, units, circuits, or circuitry may be performed by separate hardware or software components, or integrated within common or separate hardware or software components.

The techniques described in this disclosure may be implemented, at least in part, in hardware, software, firmware or any combination thereof. For example, various aspects of the techniques may be implemented within one or more microprocessors, digital signal processors (DSPs), application specific integrated circuits (ASICs), field programmable gate arrays (FPGAs), or any other equivalent integrated or discrete logic circuitry, as well as any combinations of such components, embodied in programmers, such as physician or patient programmers, stimulators, or other devices. The terms "processor," "processing circuitry," "controller" or "control module" may generally refer to any of the foregoing logic circuitry, alone or in combination with other logic circuitry, or any other equivalent circuitry, and alone or in combination with other digital or analog circuitry.

For aspects implemented in software, at least some of the functionality ascribed to the systems and devices described in this disclosure may be embodied as instructions on a computer-readable storage medium such as random access memory (RAM), read-only memory (ROM), non-volatile random access memory (NVRAM), electrically erasable programmable read-only memory (EEPROM), FLASH memory, magnetic media, optical media, or the like that is tangible. The computer-readable storage media may be referred to as non-transitory. A server, client computing device, or any other computing device may also contain a more portable removable memory type to enable easy data transfer or offline data analysis. The instructions may be executed to support one or more aspects of the functionality described in this disclosure.

In some examples, a computer-readable storage medium comprises non-transitory medium. The term "non-transitory" may indicate that the storage medium is not embodied in a carrier wave or a propagated signal. In certain examples, a non-transitory storage medium may store data that can, over time, change (e.g., in RAM or cache).

Although the foregoing examples have been illustrated in many instances as being directed to a data center 10 and monitoring sensors configured to determine if a slot of a server cabinet is or is not occupied by an electronic device or a blanking cover, aspects of the devices, systems, and techniques descried in this disclosure may be applicable to monitoring of one or more different parameters, aspects, or to the physical conditions of and related to maintaining and to operation of data center storage spaces.

Various examples have been described. These and other examples are within the scope of the following claims.

What is claimed is:

1. A system comprising:
a receiver circuit configured to receive a plurality of status indication signals, each status indication signal comprising information indicative of a cabinet occupancy status associated with one or more cabinets located in a data center storage space,
wherein each of the one or more cabinets comprises a plurality of slots configured to receive either an electronic device or a blanking cover, each of the plurality of slots comprising a sensor device configured to provide a sensor output signal indicative of whether the respective slot is (1) an open slot through which heated air generated by a plurality of electronic devices housed by the respective cabinet is permitted through a front face of the respective cabinet or (2) occupied by either an electronic device or a blanking panel; and
a processor circuit configured to:
process the received status indication signals, and determine if any of the status indication signals include an occupancy status indicating at least one slot of the one or more cabinets is an open slot through which the heated air is permitted through the front face of the respective cabinet, and
generate a status output signal indicative of any of the one or more cabinets having at least one open slot through which the heated air is permitted through the front face of the respective cabinet.

2. The system of claim 1, wherein the receiver circuit is configured to wirelessly receive the status indication signals from one or more of the cabinets.

3. The system of claim 1, wherein the processor circuit is incorporated in a portable mobile device configured to process the received status indication signals as the mobile device moves throughout the data center storage space, and to display, using a display device of the portable mobile device, the status indication of the occupancy status of one or more of the cabinets.

4. The system of claim 3, wherein the display device is configured show a location within the data center storage space of one or more cabinets having a slot of the cabinet that is not occupied by the electronic device or the blanking cover.

5. The system of claim 1, wherein one or more of plurality of slots comprising a sensor device comprises an optical sensor device.

6. The system of claim 1, wherein one or more of plurality of slots comprising a sensor device comprises a pressure sensitive sensing device.

7. The system of claim 1, wherein one or more of plurality of slots comprising a sensor device comprises a microswitch.

8. The system of claim 1, wherein one or more of plurality of slots comprising a sensor device comprises a Hall effect sensor.

9. The system of claim 1, wherein the receiver circuit is configured to receive one or more individual sensor output signals that are wirelessly transmitted by one or more of the sensor devices, each status indication signal comprising information indicative of a cabinet occupancy status associated with the one or more cabinets located in the data center storage space.

10. A system comprising:
a plurality of detection devices, each of the plurality of detection devices located at one of a plurality of slots of a cabinet, each of the plurality of detection devices configured to detect whether the slot where the detection device is located is (1) an open slot through which heated air generated by a plurality of electronic devices housed by the respective cabinet is permitted through a front face of the respective cabinet or (2) occupied by either an electronic device or a blanking panel, and to provide a status output signal indicative of an occupancy status for the respective slot; and
a cabinet status monitoring circuit comprising at least one interface configured to receive the status output signal from each of the plurality of detection devices, and to generate a cabinet status output signal based on the status output signals provided by the plurality of detection devices, the cabinet status output signal indicative of the cabinet having at least one open slot through which the heated air is permitted through the front face of the cabinet.

11. The system of claim 10, wherein one or more of the detection devices comprises an optical sensor configured to optically detect the presence or absence of a mounting fastener configured to be received and engage the cabinet at the slot where the optical sensor is located, and to provide the status output signal that is indicative of whether a device is present at the slot where the optical sensor is located based on detection of the presence or absence of the mounting fastener.

12. The system of claim 10, wherein one or more of the detection devices comprises a microswitch comprising an actuation device, the actuation device configured to be actuated when an electronic device or a blanking cover is present at a slot of the cabinet where the microswitch is located, and to provide the status output signal that is indicative of whether a device is present at the slot where the microswitch is located based on whether the actuation device is actuated.

13. The system of claim 10, wherein one or more of the detection devices comprises a pressure sensor located at a slot of the cabinet and configured to sense a force applied to the pressure sensor by an electronic device or a blanking cover received and fastened into the slot where the pressure sensor is located, the pressure sensor configured to provide the status output signal that is indicative of whether a device is present at the slot where the pressure sensor is located based on whether the pressure sensor detects the force applied to the pressure sensor.

14. The system of claim 10, wherein the one or more detection devices comprises a capacitive sensor located at a slot of the cabinet and configured to sense an electronic device or a blanking when received and fastened into the slot where the capacitive sensor is located, the capacitive sensor configured to provide the status output signal that is indicative of whether a device is present at the slot where the capacitive sensor is located.

15. A method comprising:
receiving, using communication circuitry, an occupancy status signal from each of a plurality of cabinets located in a data center storage space, the occupancy status signal comprising information indicative of an occupancy status for each of the cabinets, wherein the occupancy status for each of the cabinets indicates whether at least one slot in the cabinet is an open slot through which heated air generated by a plurality of electronic devices housed by the respective cabinet is permitted through a front face of the respective cabinet;
processing, using processing circuitry, the occupancy status signal received from each of the cabinets to determine an occupancy status indication for each of the cabinets based on the information provided in the occupancy status signal associated with each cabinet;
generating, using the processing circuitry, a graphical image comprising a graphical representation of the occupancy status indications for one or more of the cabinets included in the data center storage space, wherein each of the occupancy status indications for the one or more of the cabinets is indicative of whether the respective cabinet has at least one open slot through which the heated air is permitted through the front face of the respective cabinet; and
outputting the graphical image for display.

16. The method of claim 15, wherein generating the graphical image comprises generating a plan view of at least a portion of the data center storage space comprising a graphical representation of the relative physical location of the plurality of served cabinets located in the portion of the data center storage space.

17. The method of claim 16, wherein the plan view of the portion of the data center, when displayed on a display device, comprises one or more selectable portions of the graphical image that when selected, are configured to provide additional information related to the occupancy status of one or more cabinets located in the selected portion.

18. The method of claim 15, wherein the occupancy status signal from each of the plurality of cabinets is determined based at least in part on a plurality of output signals generated for a plurality of slots for each of the plurality of cabinets, each of the output signals generated by a sensor device comprise an optical sensor device.

19. The method of claim 15, wherein the occupancy status signal from each of the plurality of cabinets is determined based at least in part on a plurality of output signals generated for a plurality of slots for each of the plurality of cabinets, each of the output signals generated by a sensor device comprise a pressure sensor device.

20. A method comprising:
detecting, by each of a plurality of sensor devices located at respective slots of a cabinet, whether the respective slot is (1) an open slot through which heated air generated by a plurality of electronic devices housed by the respective cabinet is permitted through a front face of the respective cabinet or (2) occupied by either an electronic device or a blanking cover installed at the respective slots from each of the individual sensor devices,
generating, by each of the plurality of sensor devices, a sensor output signal, the sensor output signal indicative of whether the respective slot is an open slot through which heated air generated by a plurality of electronic devices housed by the respective cabinet is permitted through a front face of the respective cabinet or the electronic device or the blanking cover was detected by the individual sensor device;
receiving, at an input circuit, each of the sensor output signals;
generating, using processing circuitry, a cabinet status output signal based on the received sensor output signals, the cabinet status output signal comprising at least an indication of whether any of the sensor output signals indicated that a slot of the cabinet was (1) an open slot through which the heated air is permitted through the front face of the respective cabinet or (2) occupied by either the electronic device or by the blanking cover installed at the slot; and
transmitting, using communication circuitry, the cabinet status output signal to one or more external devices.

21. The method of claim 20, wherein one or more of plurality of sensor devices comprise an optical sensor device.

22. The method of claim 20, wherein one or more of plurality of sensor devices comprise a pressure sensitive sensing device.

23. The method of claim 20, wherein one or more of plurality of sensor devices comprise a microswitch.

24. The method of claim 20, wherein one or more of plurality of sensor devices comprise a Hall effect sensor.

* * * * *